(12) United States Patent
Fukami

(10) Patent No.: US 9,564,844 B2
(45) Date of Patent: *Feb. 7, 2017

(54) SEMICONDUCTOR DEVICE AND DRIVING SYSTEM

(71) Applicant: Renesas Electronics Corporation, Kanagawa-shi, Kanagawa (JP)

(72) Inventor: Ikuo Fukami, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/806,917

(22) Filed: Jul. 23, 2015

(65) Prior Publication Data

US 2015/0333674 A1    Nov. 19, 2015

Related U.S. Application Data

(63) Continuation of application No. 14/327,026, filed on Jul. 9, 2014, now Pat. No. 9,124,272.

(30) Foreign Application Priority Data

Jul. 19, 2013  (JP) ................................. 2013-150647

(51) Int. Cl.
*H03K 17/687* (2006.01)
*H02P 7/28* (2016.01)
(Continued)

(52) U.S. Cl.
CPC ............. *H02P 7/28* (2013.01); *H01L 27/0883* (2013.01); *H03K 17/063* (2013.01);
(Continued)

(58) Field of Classification Search
CPC ...... H02P 7/28; H01L 27/0883; H03K 17/063; H03K 17/162; H03K 17/168; H03K 17/687; H03K 17/731; H03K 17/732
(Continued)

(56) References Cited

U.S. PATENT DOCUMENTS 5,467,050 A * 11/1995 Clapp, III .......... H03K 17/0822
327/108
5,475,329 A * 12/1995 Jones ................. H03K 17/0822
327/108
(Continued)

FOREIGN PATENT DOCUMENTS

EP    2323259 A1    5/2011
EP    2323260 A1    5/2011
(Continued)

OTHER PUBLICATIONS

Communication dated Apr. 20, 2015 from the European Patent Office in counterpart application No. 14176312.8.

*Primary Examiner* — Ryan Jager
(74) *Attorney, Agent, or Firm* — Sughrue Mion, PLLC

(57) ABSTRACT

An output MOS transistor has a drain connected with a power supply and a source connected with an output terminal. The short-circuit MOS transistor has a source connected with the output terminal. The short-circuit MOS transistor is formed in a semiconductor substrate connected with the power supply. A switching device is formed in a semiconductor region which is formed in the semiconductor substrate, and contains a first diffusion layer connected with the gate of the output MOS transistor and a second diffusion layer formed in the semiconductor region and connected with the drain of the short-circuit MOS transistor.

15 Claims, 28 Drawing Sheets

(51) Int. Cl.
  *H03K 17/16* (2006.01)
  *H03K 17/73* (2006.01)
  *H03K 17/732* (2006.01)
  *H01L 27/088* (2006.01)
  *H03K 17/06* (2006.01)

(52) U.S. Cl.
  CPC ......... *H03K 17/162* (2013.01); *H03K 17/168* (2013.01); *H03K 17/687* (2013.01); *H03K 17/731* (2013.01); *H03K 17/732* (2013.01); *H03K 2217/0018* (2013.01); *H03K 2217/0081* (2013.01)

(58) Field of Classification Search
  USPC .................................................. 327/109–112
  See application file for complete search history.

(56) References Cited

U.S. PATENT DOCUMENTS

| | | | |
|---|---|---|---|
| 8,390,340 B2 | 3/2013 | Nakahara | |
| 2005/0168264 A1* | 8/2005 | Fukami | H03K 17/063 327/535 |
| 2010/0046123 A1* | 2/2010 | Fukami | H03K 17/0822 361/18 |
| 2011/0279152 A1* | 11/2011 | Nakahara | H01L 27/0623 327/110 |
| 2014/0022001 A1 | 1/2014 | Nakahara et al. | |
| 2015/0333674 A1* | 11/2015 | Fukami | H01L 27/0883 318/139 |

FOREIGN PATENT DOCUMENTS

| | | |
|---|---|---|
| JP | 03-198421 A | 8/1991 |
| WO | 2012/137651 A1 | 10/2012 |

\* cited by examiner

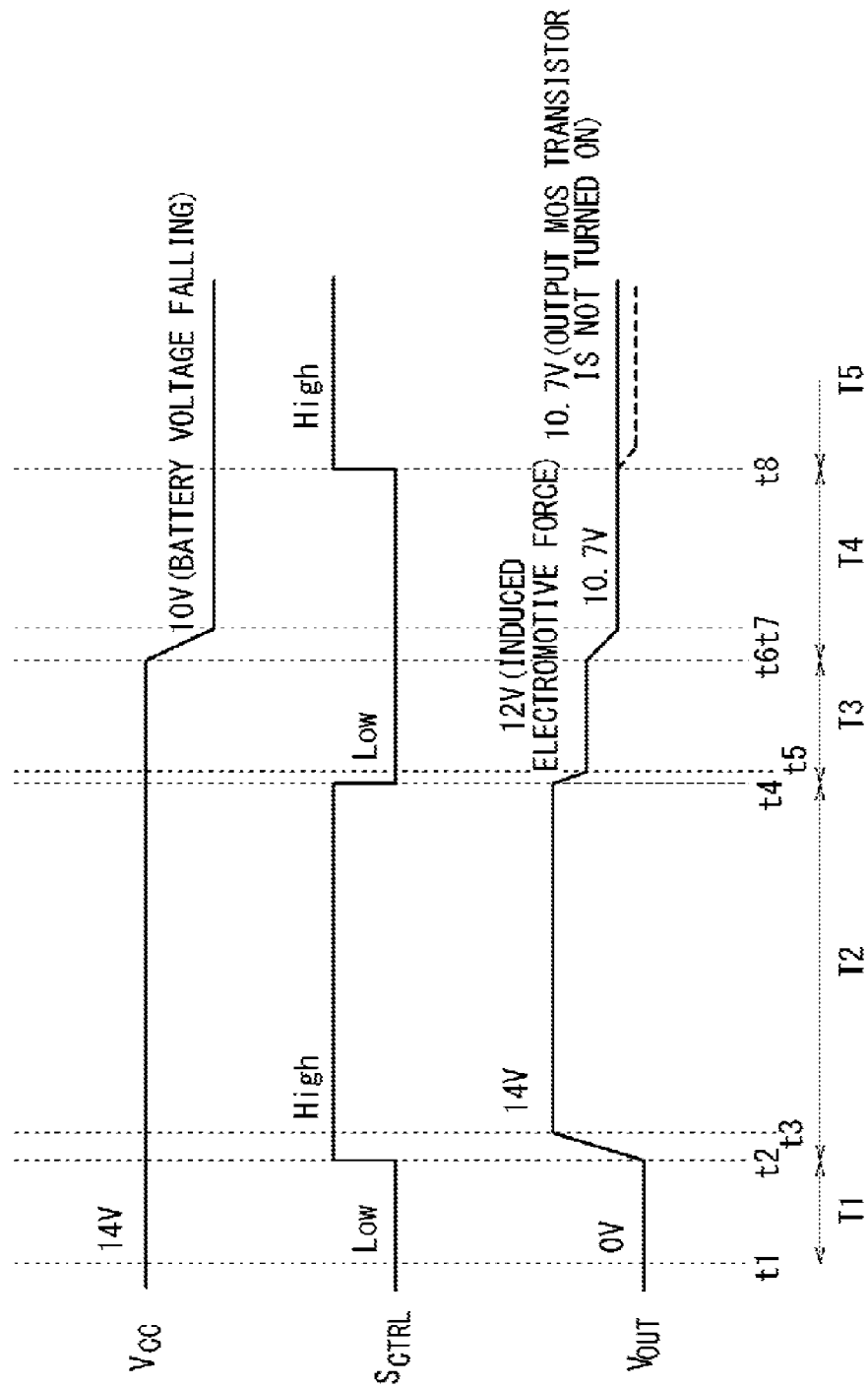

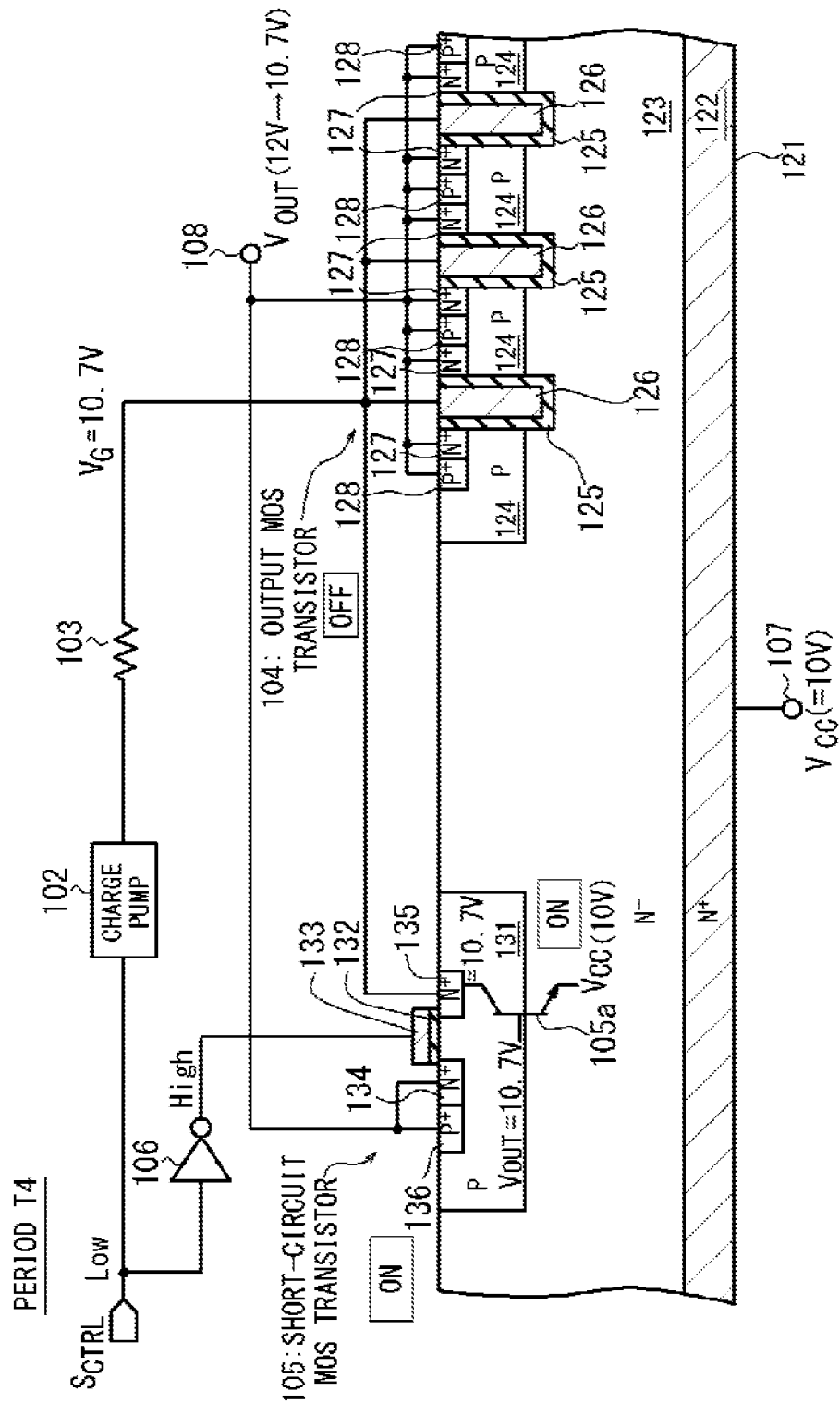

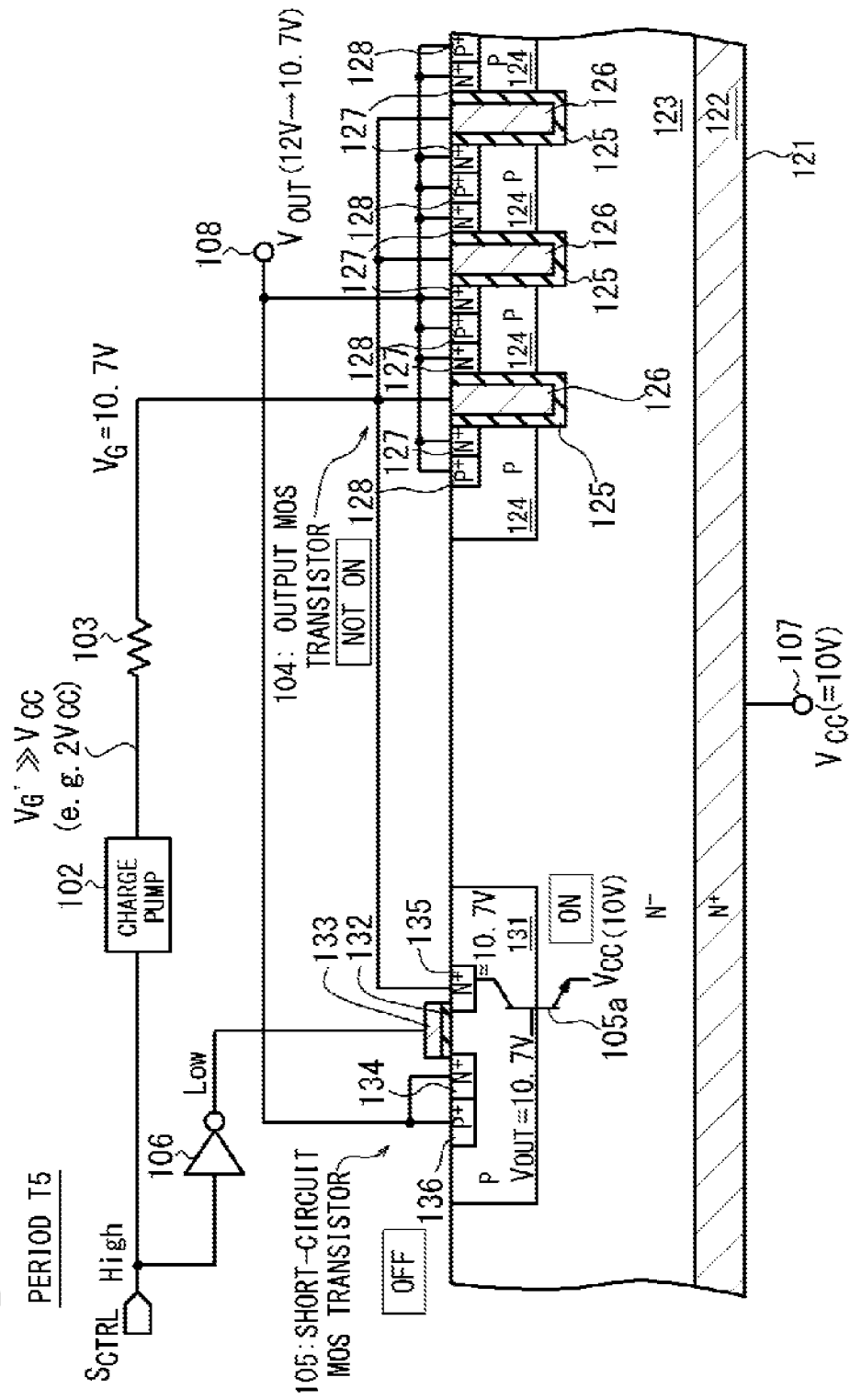

PERIOD T1

PERIOD T2

PERIOD T2

PERIOD T3

PERIOD T3

PERIOD T5

PERIOD T5

SEMICONDUCTOR DEVICE AND DRIVING SYSTEM

CROSS REFERENCE

This application is a Continuation of U.S. application Ser. No. 14/327,026, filed on Jul. 9, 2014, and claims the priority of Japanese Patent Application No. JP 2013-150647, filed on Jul. 19, 2013. The entire disclosures of the prior applications are considered part of the disclosure of the accompanying continuation application, and are hereby incorporated by reference.

TECHNICAL FIELD

The present invention is related to a semiconductor device and a driving system, and especially, a semiconductor device suitable to drive an inductive load.

BACKGROUND ART

A high-side driver of the configuration that an output transistor is connected between an output terminal (terminal connected with a load) and a power supply, is known as one of the semiconductor devices, each of which supplies the power to a load. In the high-side driver of such a configuration, by switching the output transistor, the supply of the power to the load is carried out or the supply of the power to the load is blocked off. For example, as an output transistor, a MOS transistor and an IGBT (insulated gate bipolar transistor) are used.

When the MOS transistor is used as the output transistor (hereinafter, such a MOS transistor is referred to as "an output MOS transistor"), a short-circuit switch is sometimes connected between the gate and the source in the output MOS transistor in the high-side driver (for example, reference to Patent Literature 1 (JP H03-198421A). The short-circuit switch is used to surely set the output MOS transistor to an OFF state by short-circuiting the gate and the source in the output MOS transistor, and the short-circuit switch is turned on when the output MOS transistor is turned off. As the short-circuit switch, a MOS transistor is generally used. Below, the MOS transistor which is used as the short-circuit switch is referred to as a short-circuit MOS transistor.

CITATION LIST

[Patent literature 1] JP H03-198421A

SUMMARY OF THE INVENTION

The inventor is studying about the high-side driver including an output transistor and a short-circuit MOS transistor as mentioned above.—

In the high-side driver of such a configuration, one of the problems found by the inventor is in that when the voltage of the output terminal becomes higher than the power supply voltage, a parasitic bipolar transistor of the short-circuit MOS transistor is turned on, so that the output transistor cannot be turned on. Note that the voltage of the output terminal sometimes becomes higher than the power supply voltage, when the load connected with the output terminal is an inductive load. When the output transistor cannot be turned on, the expected voltage cannot be outputted from the output terminal, which hinders the control of the supply of power to the load.

Other problems and new features will become clear from the description of this specification and the attached drawings.

In one embodiment, the semiconductor device includes an output transistor, a short-circuit MOS transistor and a switching device. The output transistor includes a first terminal connected with a power supply and a second terminal connected with an output terminal which is connected with a load. A source of the short-circuit MOS transistor is connected with the output terminal. The switching device is connected between a control terminal of the output transistor and a drain of the short-circuit MOS transistor. The short-circuit MOS transistor is formed on a semiconductor substrate connected with the power supply. The switching device includes a semiconductor region formed in the semiconductor substrate, a first diffusion layer formed in the semiconductor region and connected with the control terminal of the output transistor, and a second diffusion layer formed in the semiconductor region and connected with the drain of the short-circuit MOS transistor. The switching device is configured to carry out an ON/OFF control based on the voltage of the semiconductor region.

In another embodiment, the semiconductor device includes an output transistor, a short-circuit MOS transistor and a switch transistor which is a depletion-type MOS transistor. The output transistor has a first terminal connected with a power supply and a second terminal connected with an output terminal which is connected with a load. A source of the short-circuit MOS transistor is connected with the output terminal. The short-circuit MOS transistor and the switch transistor are formed in the semiconductor substrate connected with the power supply. The switch transistor has a drain connected with the control terminal of the output transistor and has a source and a gate connected with the drain of the short-circuit MOS transistor. A voltage of the back gate of the switch transistor is controlled according to a control signal which controls the output transistor and the short-circuit MOS transistor.

According to the above embodiments, in the semiconductor device having the output transistor and the short-circuit MOS transistor, a failure caused by the operation of a parasitic bipolar transistor of the short-circuit MOS transistor can be prevented.

BRIEF DESCRIPTION OF THE DRAWINGS

FIG. 4 is a time chart showing an operation example of the high-side driver IC of FIG. 2 and FIG. 3.

FIG. 5A is a cross section showing a state of the high-side driver IC in a period T4 of FIG. 4.

FIG. 5B is a cross section showing a state of the high-side driver IC in a period T5 of FIG. 4.

DESCRIPTION OF EMBODIMENTS

Below, a high-side driver which includes an output transistor and a short-circuit MOS transistor, and problems that are caused in the high-side driver having such a configuration will be is described in detail, in order to facilitate the understanding of the technical meaning of the embodiments.

Figure 1:
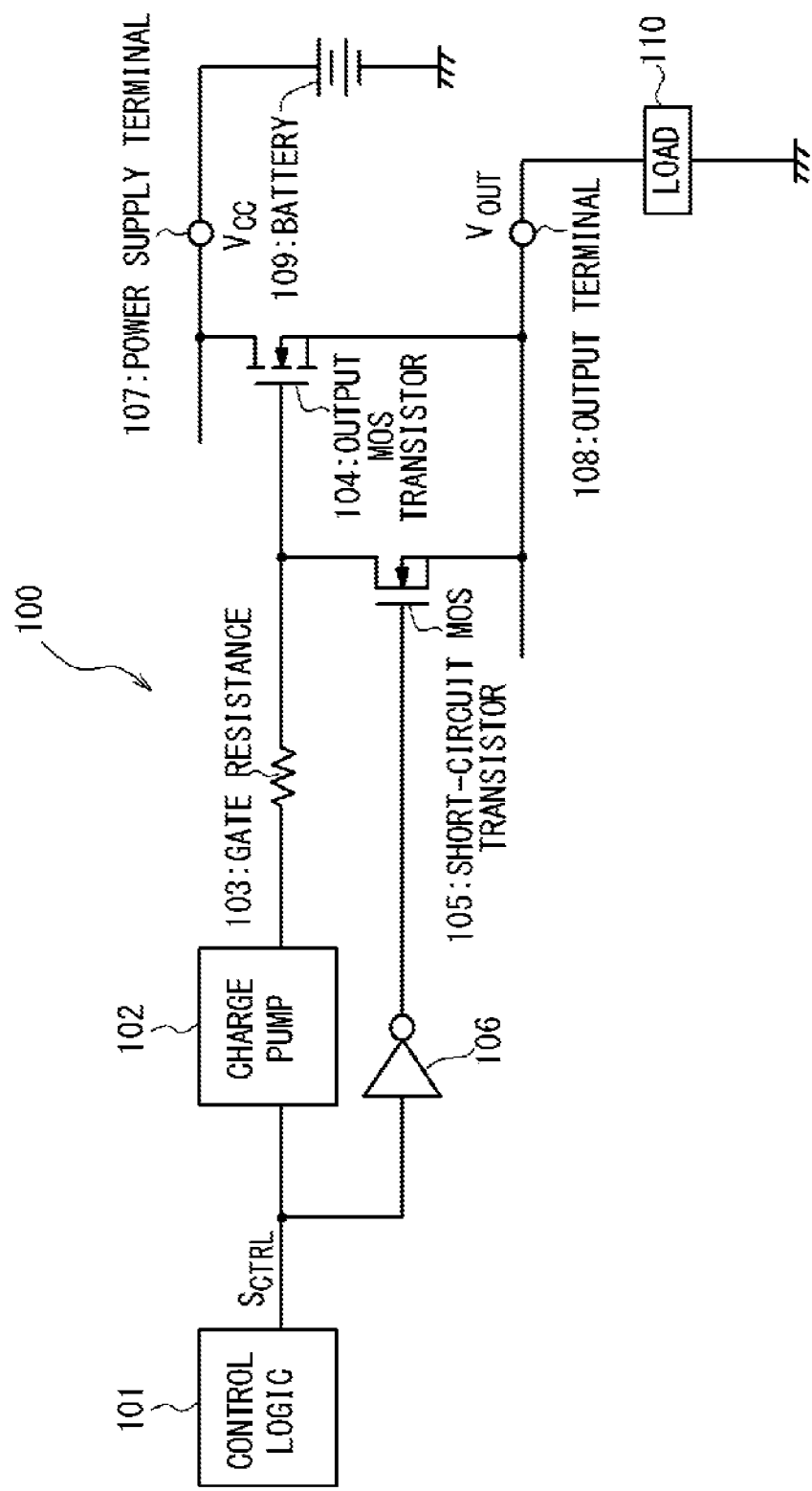
FIG. 1 is a diagram schematically showing a configuration example of a high-side driver which includes an output MOS transistor and a short-circuit MOS transistor.

FIG. 1 is a circuit diagram schematically showing an example of the configuration of the high-side driver 100. The high-side driver 100 of FIG. 1 includes a control logic circuit 101, a charge pump 102, a gate resistance 103, an output MOS transistor 104, a short-circuit MOS transistor 105, an inverter 106, a power supply terminal 107, and an output terminal 108. Here, the power supply terminal 107 is a terminal to which a power supply voltage is supplied from a power supply (battery 109 in this embodiment), and the output terminal 108 is a terminal connected with a load 110. Below, the voltage of the power supply terminal 107 is shown as a voltage $V_{CC}$ and the voltage of the output terminal 108 is shown as a voltage $V_{OUT}$.

The control logic circuit 101 generates a control signal $S_{CTRL}$ which controls the turning-on/turning-off of the output MOS transistor 104.

The output of the charge pump 102 is connected with a gate of the output MOS transistor 104 through the gate resistance 103, and the charge pump 102 operates as a drive circuit which drives the gate of the output MOS transistor 104 in response to the control signal $S_{CTRL}$. In detail, the charge pump 102 drives the gate of the output MOS transistor 104 to a voltage which is higher than the voltage $V_{CC}$ (typically, about twice of the voltage $V_{CC}$) when the control signal $S_{CTRL}$ is in a high level and stops the drive of the gate of the output MOS transistor 104 when the control signal $S_{CTRL}$ is in a low level.

The output MOS transistor 104 is connected between the power supply terminal 107 and the output terminal 108 and in the configuration of FIG. 1, an N-channel MOS transistor is used as the output MOS transistor 104. The output MOS transistor 104 has a drain connected with the power supply terminal 107, and a source connected with the output terminal 108.

The short-circuit MOS transistor 105 is used as a short-circuiting switch which connects the gate and the source in the output MOS transistor 104. In the configuration of FIG. 1, an N-channel MOS transistor is used as the short-circuit MOS transistor 105. The short-circuit MOS transistor 105 has a drain connected with the gate of the output MOS transistor 104, and a source connected with the source of the output MOS transistor 104 (or the output terminal 108).

The inverter 106 generates and supplies an inversion signal of the control signal $S_{CTRL}$ (a complementary signal) to the gate of the short-circuit MOS transistor 105.

In the high-side driver 100 of such a configuration, when the control signal $S_{CTRL}$ is set to the high level by the control logic circuit 101, the gate voltage of the output MOS transistor 104 is set to a voltage which is higher than the voltage $V_{CC}$ so that the output MOS transistor 104 is set to the ON state. When the output MOS transistor 104 is set to the ON state, the voltage is supplied from the battery 109 to the load 110 and the load 110 is driven. On the other hand, when the control signal $S_{CTRL}$ is set to the low level, the drive of the gate of the output MOS transistor 104 by the charge pump 102 is stopped, and the source and the gate in the output MOS transistor 104 are short-circuited by the short-circuit MOS transistor 105. Thus, the output MOS transistor 104 is set to the OFF state.

In the high-side driver 100 of FIG. 1, the output MOS transistor 104 and the short-circuit MOS transistor 105 may be integrated monolithically (i.e. on an identical semiconductor substrate) and may be formed on separate semiconductor substrates. In the monolithic configuration, the number of parts of the high-side driver 100 is decreased and is useful to the cost reduction. On the other hand, in case that electric characteristics of the output MOS transistor differ with those of the control circuit (which contains the short-circuit MOS transistor), it becomes easy to provide the high-side driver of various performances, by adopting a multi-chip configuration of a first chip having the output MOS transistor and a second chip having the control circuit.

In addition, the applicant is considering a configuration of the high-side driver 100 so as to be able to drive an inductive load. In recent years, it is required that the high-side driver 100 drives various types of equipments. For example, there is a case that it is requested in an in-vehicle device to drive the inductive load such as a DC (direct current) motor.

Figure 2:
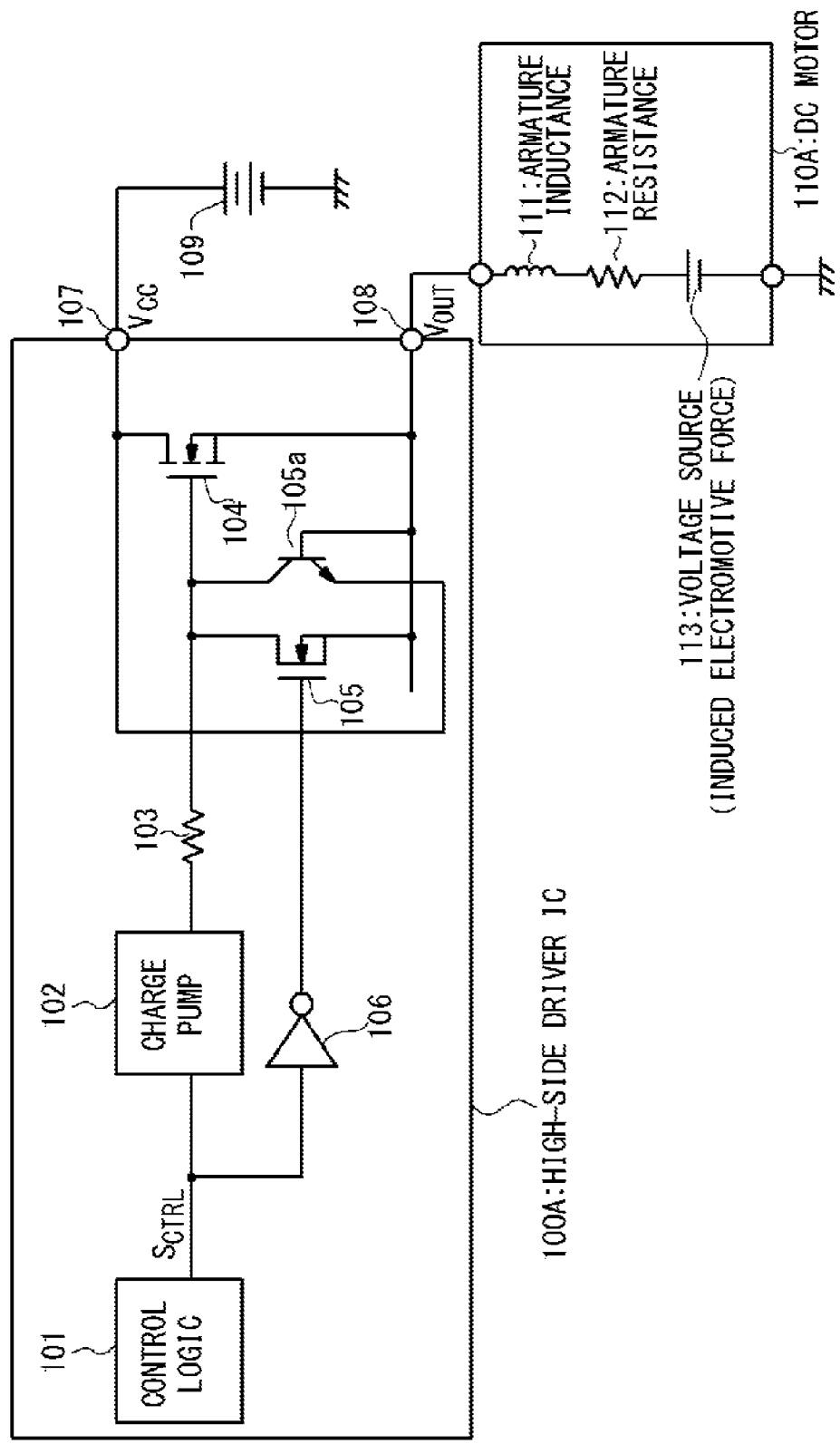
FIG. 2 is an equivalent circuit diagram showing a configuration example of the high-side driver IC which includes the output MOS transistor and the short-circuit MOS transistor.

FIG. 2 shows an equivalent circuit of the high-side driver IC 100A of such a configuration. In the configuration of FIG. 2, on the high-side driver IC 100A, a control logic circuit 101, a charge pump 102, a gate resistance 103, an output MOS transistor 104, a short-circuit MOS transistor 105, an inverter 106, a power supply terminal 107 and an output terminal 108 are integrated monolithically. As the load which is connected with the output terminal 108, the DC motor 110A is used. In an equivalent circuit, the DC motor 110A can be represented as a series-connection of an armature inductance 111, an armature resistance 112 and a voltage source 113 which generates an induced electromotive force.

Figure 3:
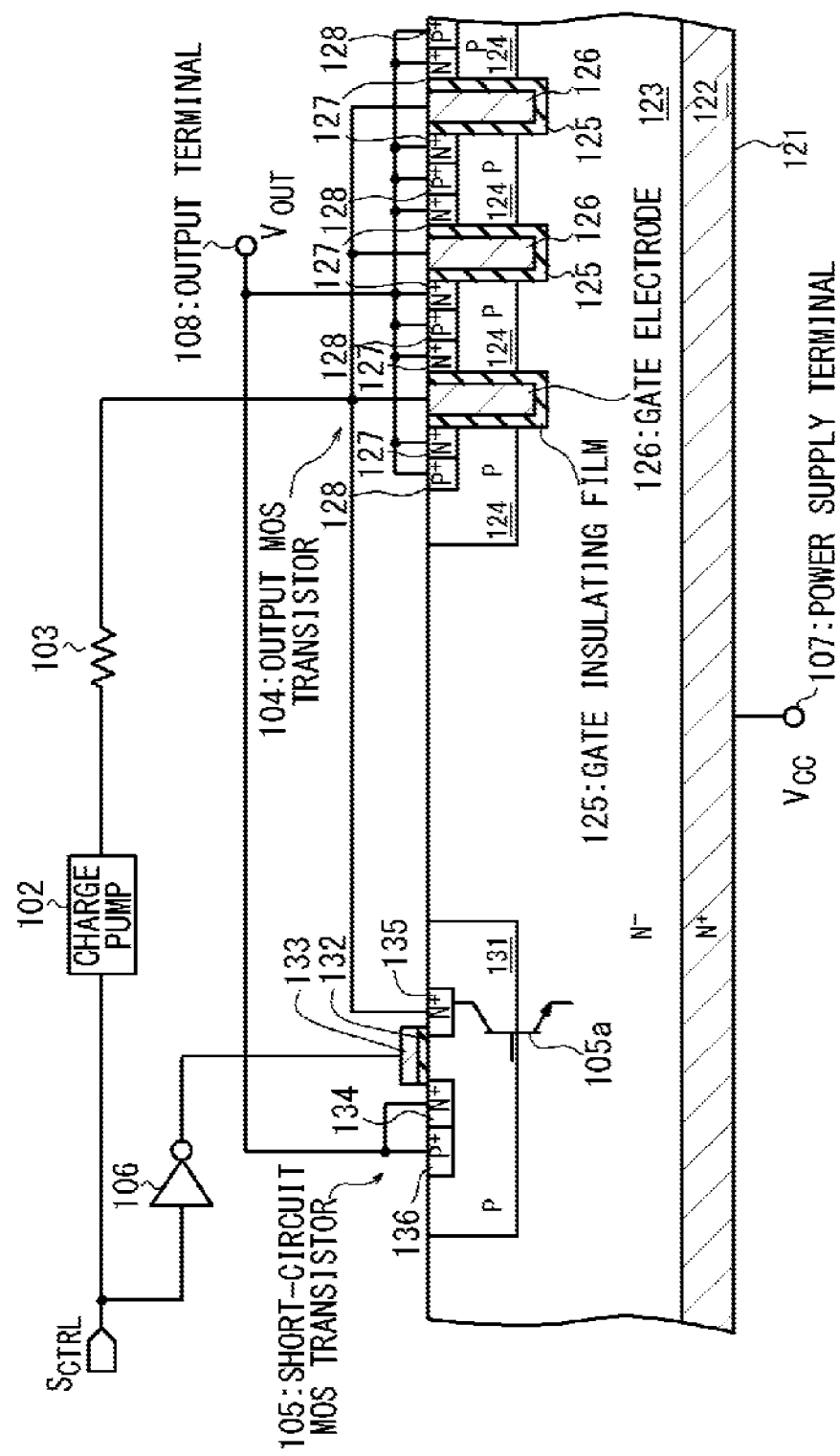
FIG. 3 is a cross section showing a configuration example of a portion where the output MOS transistor and the short-circuit MOS transistor in the high-side driver IC of FIG. 2 are formed.

FIG. 3 is a cross section conceptually showing the output MOS transistor 104 and the short-circuit MOS transistor 105 in the high-side driver IC 100A of FIG. 2. The output MOS transistor 104 and the short-circuit MOS transistor 105 are both formed on a semiconductor substrate 121. The semiconductor substrate 121 includes an $N^+$ type substrate 122 and an $N^-$ type epitaxial layer 123 formed on the $N^+$ type substrate 122. An N-type impurity is heavily doped in the $N^+$ type substrate 122. Here, the phrase "impurity is heavily doped" means in this Specification and CLAIMS that the impurity is doped in a high impurity concentration to an extent that a degenerate semiconductor is formed (typically, about $10^{20}/cm^3$). The $N^+$ type substrate 122 is connected with the power supply terminal 107. The N-type impurity is doped in the $N^-$ type epitaxial layer 123. The output MOS transistor 104 and the short-circuit MOS transistor 105 are formed on the surface section of the $N^-$ type epitaxial layer 123.

FIG. 3 is a cross section showing the structure in which the output MOS transistor 104 is formed as an N-channel vertical-type MOSFET (MOS field effect transistor) having a trench gate structure. In detail, the P-type body region 124 in which P-type impurity is doped, is formed in the surface section of the $N^-$ type epitaxial layer 123. A trench is formed to pass through the P-type body region 124, and a gate insulating film 125 and a gate electrode 126 are formed to embed the trench. Here, the gate insulating film 125 is formed along the inner wall of the trench and the gate electrode 126 is formed to oppose to a P-type body region 124 and an $N^-$ type epitaxial layer 123 through the gate insulating film 125. In addition, an $N^+$-type diffusion layer 127 in which an N-type impurity is heavily doped, is formed in the surface section of the P-type body region 124 in the position adjacent to the gate insulating film 125. Moreover, the $P^+$-type diffusion layer 128 in which the P-type impurity is heavily doped, is formed in the surface section of the P-type body region 124. In the output MOS transistor 104 of such a configuration, the $N^+$-type diffusion layer 127 functions as a source and the semiconductor substrate 121 and the $N^-$ type epitaxial layer 123 function as a drain. Also, the $P^+$-type diffusion layer 128 functions as a back gate terminal.

On the other hand, the short-circuit MOS transistor 105 is formed as a lateral-type N-channel MOSFET. In detail, a P-type body region 131 in which the P-type impurity is heavily doped, is formed in the surface section of the $N^-$ type epitaxial layer 123. An $N^+$-type diffusion layer 134 and an $N^+$-type diffusion layer 135 are formed in the surface section of the P-type body region 131. The N-type impurity is heavily doped in both of the $N^+$-type diffusion layer 134 and the $N^+$-type diffusion layer 135. A gate insulating film 132 is formed to cover a region (channel region) between the $N^+$-type diffusion layer 134 and the $N^+$-type diffusion layer 135 in the P-type body region 131, and the gate electrode 133 is formed on the gate insulating film 132. In addition, a $P^+$-type diffusion layer 136 in which the P-type impurity is heavily doped, is formed in the surface section of the P-type body region 131. In the short-circuit MOS transistor 105 of such a configuration, the $N^+$-type diffusion layer 134 functions as a source and the $N^+$-type diffusion layer 135 functions as a drain. Also, the $P^+$-type diffusion layer 136 functions as a back gate terminal.

Note that a parasitic bipolar transistor 105a is formed in the short-circuit MOS transistor 105 in the structure of FIG. 3. More specifically, the $N^+$-type diffusion layer 135, the P-type body region 131 and the $N^-$ type epitaxial layer 123 function as a collector, a base and an emitter of the NPN-type parasitic bipolar transistor, respectively. Note that the parasitic bipolar transistor 105a is shown in the equivalent circuit of FIG. 2.

One problem is in that when the voltage $V_{OUT}$ of the output terminal 108 is higher than the voltage $V_{CC}$ of the power supply terminal 107, the parasitic bipolar transistor 105a is turned on regardless of the signal level of the control signal $S_{CTRL}$. In detail, the voltage of the P-type body region 131 is almost coincident with the voltage $V_{OUT}$ of the output terminal 108 and the voltage of the $N^-$ type epitaxial layer 123 is almost coincident with the voltage $V_{CC}$ of the power supply terminal 107. Therefore, when the voltage $V_{OUT}$ of the output terminal 108 is higher than the voltage $V_{CC}$ of the power supply terminal 107, the voltage of the P-type body region 131 is higher than the voltage of the $N^-$ type epitaxial layer 123. Here, note that there is a case that when an inductive load (e.g. a DC motor 110A) is connected with the output terminal 108, the voltage $V_{OUT}$ of the output terminal 108 becomes higher than the voltage $V_{CC}$ of the power supply terminal 107 due to the induced electromotive force. When the voltage $V_{OUT}$ of the output terminal 108 becomes higher than the voltage $V_{CC}$ of the power supply terminal 107, the voltage of the base of the NPN-type parasitic bipolar transistor 105a becomes higher than the voltage of the emitter so that the parasitic bipolar transistor 105a is turned on.

When the parasitic bipolar transistor 105a is turned on, the gate voltage of the output MOS transistor 104 becomes the voltage $V_{CC}$ so that the output MOS transistor 104 cannot be turned on. This means that it becomes impossible to control the output MOS transistor 104 based on the control signal $S_{CTRL}$, and this is not desirable in operation. Below, in order to facilitate understanding of the problem of the parasitic bipolar transistor 105a of the short-circuit MOS transistor 105, the operation of the high-side driver IC 100A of the configuration of FIG. 2 and FIG. 3 will be described with reference to FIG. 4.

Period T1:

A period T1 (time t1 to time t2) is a period for which the high-side driver IC 100A is in the initial state. It is supposed that in the period T1, the DC motor 110A is in a stop state, the voltage $V_{CC}$ of the power supply terminal 107 (that is, the power supply voltage supplied from the battery 109 to the high-side driver IC 100A) is 14 V, and the control signal $S_{CTRL}$ is in the low level. Here, note that when the DC motor 110A is in the stop state, the inductive electromotive force is not generated and the voltage $V_{OUT}$ of the output terminal 108 is the ground voltage GND (0 V).

Period T2:

It is supposed that the control signal $S_{CTRL}$ is changed from the low level to the high level by the control logic circuit 101 in a start time t2 of a period T2 (time t2 to time t4). At this time, the gate voltage $V_G$ of the output MOS transistor 104 is driven to a voltage which is higher than the voltage $V_{CC}$ of the power supply terminal 107 (typically 2$V_{CC}$) by the charge pump 102, so that the output MOS transistor 104 is turned on. At this time, the voltage $V_{OUT}$ of the output terminal 108 is pulled up to the power supply voltage (14V) supplied from the battery 109 (time t3), and the supply of the power from the battery 109 to the DC motor 110A is started.

Period T3:

In a start time t4 of a period T3 (time t4 to time t6), when the control signal $S_{CTRL}$ is pulled down from the high level to the low level, the drive of the gate of the output MOS transistor 104 by the charge pump 102 is stopped, and the short-circuit MOS transistor 105 is turned on. Thus, the output MOS transistor 104 is turned off.

Here, when the rotor of the DC motor 110A continues to rotate in the inertia, a voltage is generated in the armature due to the induced electromotive force, and is applied to the output terminal 108. Therefore, the voltage $V_{OUT}$ of the output terminal 108 does not return to the ground voltage GND and sometimes becomes some voltage. FIG. 4 shows a case where the voltage $V_{OUT}$ of the output terminal 108 becomes 12 V due to the induced electromotive force at a time t5. At this time, because the short-circuit MOS transistor 105 is turned on, the gate voltage $V_G$ of the output MOS transistor 104 is also 12 V.

Period T4:

After that, it is supposed that the voltage of the battery 109 is reduced at a start time t6 of a period T4 (time t6 to time t8). For example, there is a case that when the battery 109 supplies power to devices other than the high-side driver IC 100A, the voltage of the battery 109 reduces depending on the power consumption of the devices. FIG. 4 shows an operation when the voltage of the battery 109, i.e. the voltage $V_{CC}$ of the power supply terminal 107 reduces to 10 V at a time t7, and FIG. 5A shows a voltage of each node of the high-side driver IC 100A at the time t7.

As shown in FIG. 5A, when the voltage of the battery 109, i.e. the voltage $V_{CC}$ of the power supply terminal 107 reduces so that the voltage $V_{OUT}$ of the output terminal 108 is higher than a summation of the voltage $V_{CC}$ of the power supply terminal 107 and the forward voltage $V_F$ of a PN junction (about 0.7 V in case that the N⁻ type epitaxial layer 123 is formed of silicon), the parasitic bipolar transistor 105a of the short-circuit MOS transistor 105 is turned on. When the parasitic bipolar transistor 105a is turned on, the voltage of the P-type body region 131 reduces to the summation of the voltage $V_{CC}$ of the power supply terminal 107 and the forward voltage $V_F$ of the PN junction, i.e. 10.7 V, and the voltage $V_{OUT}$ of the output terminal 108 also reduces to 10.7 V. At this time, because the short-circuit MOS transistor 105 is turned on so that the source and the gate in the output MOS transistor 104 are short-circuited, and the gate voltage of the output MOS transistor 104 reduces to 10.7 V. However, it does not give any influence at this stage that the parasitic bipolar transistor 105a is turned on, because the control signal $S_{CTRL}$ is in the low level and it is originally expected that the output MOS transistor 104 is in the off state.

Period T5:

In this state, it is supposed that the control signal $S_{CTRL}$ is pulled up from the low level to the high level at a start time t8 of a period T5 (since time t8). FIG. 5B shows the voltage of each node of the high-side driver IC 100A in the period T5. When the control signal $S_{CTRL}$ is pulled up to the high level, it is expected that the gate voltage $V_G$ of the output MOS transistor 104 is originally driven to a voltage which is higher than the voltage $V_{CC}$ of the power supply terminal 107 (typically, 2$V_{CC}$) by the charge pump 102, so that the output MOS transistor 104 is turned on. In this case, the voltage $V_{OUT}$ of the output terminal 108 should become 10 V. In FIG. 5B, the voltage which is outputted from the charge pump 102 is shown as a symbol $V_G'$.

However, because the parasitic bipolar transistor 105a is kept in the ON state, the gate voltage of the output MOS transistor 104 is kept to 10.7 V, and therefore, the output MOS transistor 104 cannot be turned on. At this time, the voltage $V_{OUT}$ of the output terminal 108 has become 10.7 V (not 10 V which is originally expected). This means that the function of the switching control of the output MOS transistor 104 based on the control signal $S_{CTRL}$ is lost, and it is desirable to take some measures.

FIG. 3, FIG. 5A and FIG. 5B show an example in which the output MOS transistor 104 and the short-circuit MOS transistor 105 are monolithically integrated (i.e. on an identical semiconductor substrate). However, because the operation is the same when the N⁺ type substrate 122 and the N⁻ type epitaxial layer 123 are separated between the output MOS transistor 104 and the short-circuit MOS transistor 105 (in other words, when the output MOS transistor 104 and the short-circuit MOS transistors 105 are formed on separate chips), similar handling is required.

In the semiconductor device (the high-side driver IC) of the present embodiment which is described below, the configuration to cope with such a problem is adopted.

First Embodiment

Figure 6:
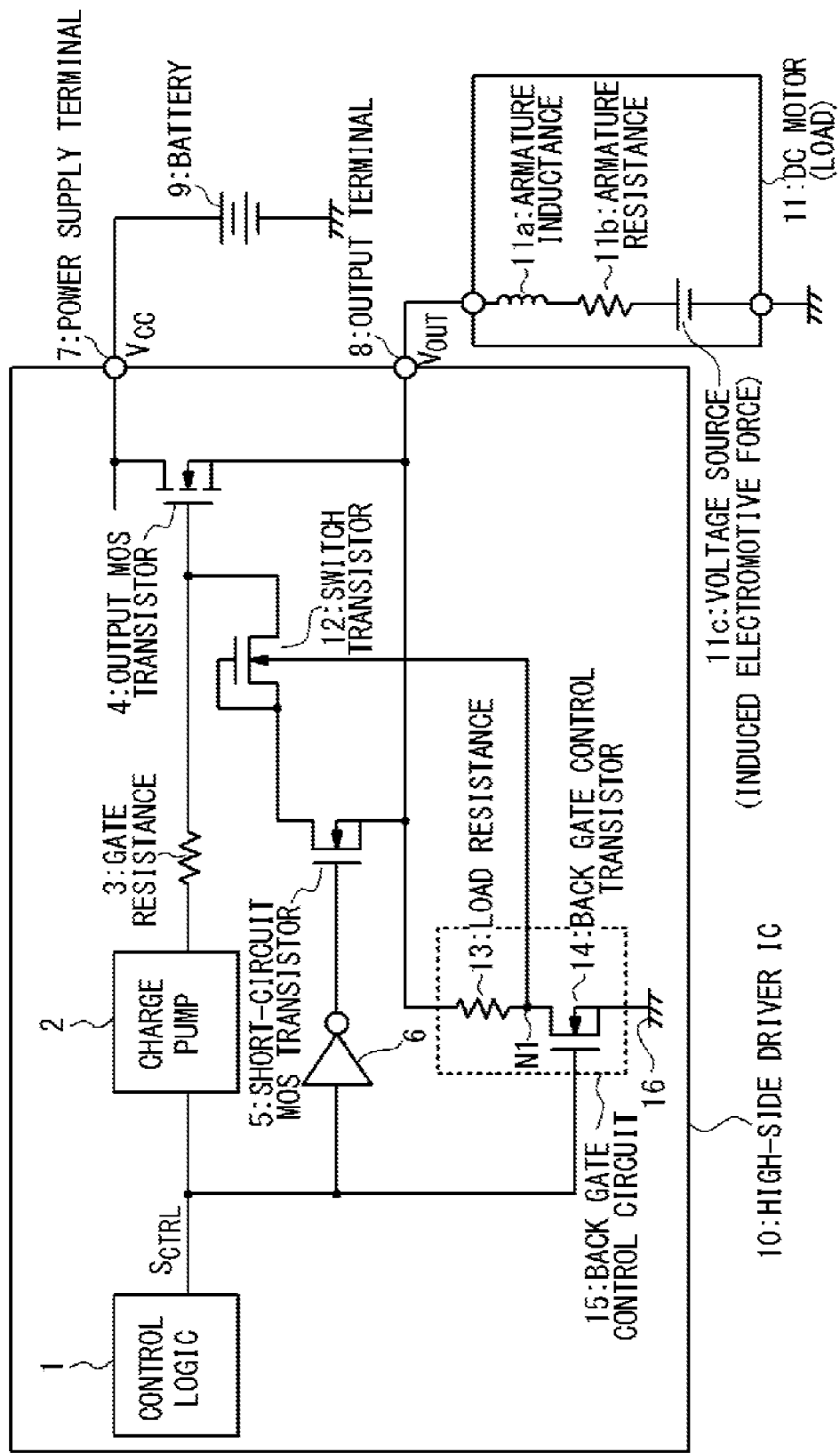
FIG. 6 is a diagram schematically showing the configuration of the high-side driver IC in the first embodiment.

FIG. 6 is a circuit diagram showing the configuration of the high-side driver IC 10 in the first embodiment. The high-side driver IC 10 of the present embodiment is applied to a driving system which drives the DC motor 11. As mentioned above, the DC motor 11 can be expressed in an equivalent circuit as an inductive load which includes a series connection of an armature inductance 11a, an armature resistance 11b and a voltage source 11c which generates an induced electromotive force.

The high-side driver IC 10 of the present embodiment includes the control logic circuit 1, the charge pump 2, the gate resistance 3, the output MOS transistor 4, the short-circuit MOS transistor 5, the inverter 6, the power supply terminal 7 and the output terminal 8, like the high-side driver IC 100A of FIG. 2. Here, the power supply terminal 7 is a terminal to which a power supply voltage is supplied from the power supply 9 (battery 9 in the present embodiment), and the output terminal 8 is a terminal connected with the load, i.e. the DC motor 11 in the present embodiment. Below, the voltage of the power supply terminal 7 is expressed as the voltage $V_{CC}$ and the voltage of the output terminal 8 is expressed as the voltage $V_{OUT}$.

The control logic circuit 1 generates the control signal $S_{CTRL}$ which controls the turn-on and turn-off of the output MOS transistor 4. For example, the operation that the control logic circuit 1 generates the control signal $S_{CTRL}$ may be controlled by a CPU (central processing unit) for controlling the high-side driver IC 10 externally.

The output of the charge pump 2 is connected with the gate (control terminal) of the output MOS transistor 4 through the gate resistance 3 and operates as a driving circuit which drives the gate of the output MOS transistor 4 in response to the control signal $S_{CTRL}$. In detail, the charge pump 2 drives the gate of the output MOS transistor 4 to a voltage which is higher than the voltage $V_{CC}$ (typically, about twice of voltage $V_{CC}$) when the control signal $S_{CTRL}$ is in the high level, and stops the driving the gate of the output MOS transistor 4 when the control signal $S_{CTRL}$ is in the low level.

The gate resistance 3 suppresses the charging or discharging current which flows between the charge pump 2 and the gate of the output MOS transistor 4 to protect the output MOS transistor 4.

The output MOS transistor 4 has a drain (a first terminal) connected with the power supply terminal 7 and a source (a second terminal) connected with the output terminal 8, and a function of electrically connecting the drain (the first terminal) and the source (the second terminal) or disconnecting them in response to the voltage of the gate (the control terminal). In the configuration of FIG. 6, the N-channel MOS transistor is used as the output MOS transistor 4. Note that the back gate of the output MOS transistor 4 is connected with the source.

The short-circuit MOS transistor 5 is used as a short-circuiting switch which connects the gate and the source in the output MOS transistor 4 in response to the inversion signal of the control signal $S_{CTRL}$ which is outputted from the inverter 6. In the configuration of FIG. 6, the N-channel MOS transistor is used as the short-circuit MOS transistor 5. The short-circuit MOS transistor 5 has a drain connected with the gate of the output MOS transistor 4 (through the following switch transistor 12), and a source connected with the source of the output MOS transistor 4 (or the output terminal 8). Note that the back gate of the short-circuit MOS transistor 5 is connected with the source.

The inverter 6 generates and supplies the inversion signal of the control signal $S_{CTRL}$ (a complementary logic signal) to the gate of the short-circuit MOS transistor 5.

In addition, the high-side driver IC 10 of the present embodiment includes a switch transistor 12, a load resistance 13 and a back gate control transistor 14.

The switch transistor 12 is a MOS transistor which functions as a switch connected between the gate of the output MOS transistor 4 and the drain of the short-circuit MOS transistor 5. In the present embodiment, a depletion-type N-channel MOS transistor is used as the switch transistor 12. The gate and the source in the switch transistor 12 are connected with the drain of the short-circuit MOS transistor 5 in common, and the drain of the switch transistor 12 is connected with the gate of the output MOS transistor 4. Here, note that the ON/OFF control of the switch transistor 12 is carried out by controlling the voltage of the back gate (or, the voltage of the P-type body region), because the depletion-type N-channel MOS transistor is in the state of normally ON) and moreover the source and the gate in the switch transistor 12 are connected.

The load resistance 13 and the back gate control transistor 14 configure a back gate control circuit 15 which controls the voltage of the back gate of the switch transistor 12 (or the P-type body region) in response to the control signal $S_{CTRL}$. In detail, the load resistance 13 is connected between a connection node N1 connected with the back gate of the switch transistor 12 and the source of the short-circuit MOS transistor 5 (i.e. the output terminal 8).

Also, the back gate control transistor 14 operates as a switching device which connects or disconnects the connection node N1 and the ground terminal 16 in response to the control signal $S_{CTRL}$. The back gate control transistor 14 has the drain connected with the connection node N1, and the source connected with the ground terminal 16. The back gate control transistor 14 has the gate supplied with the control signal $S_{CTRL}$ and the back gate connected with the ground terminal 16. The back gate control circuit 15 of such a configuration sets the back gate of the switch transistor 12 to the ground voltage GND when the control signal $S_{CTRL}$ is in the high level. On the other hand, the back gate control circuit 15 carries out the operation to set the back gate of the switch transistor 12 to a voltage which is identical with the voltage $V_{OUT}$ of the output terminal 8 when the control signal $S_{CTRL}$ is in the low level.

The control logic circuit 1, the charge pump 2, the gate resistance 3, the output MOS transistor 4, the short-circuit MOS transistor 5, the inverter 6, the power supply terminal 7, the output terminal 8, the switch transistor 12, the load resistance 13, back gate control transistor 14 are integrated monolithically (i.e. on the identical semiconductor substrate). Note that a multi-chip configuration may be used for the semiconductor device of the present embodiment, as mentioned later. For example, the semiconductor device of the present embodiment may be provided with a first semiconductor chip on which the gate resistance 3 and the output MOS transistor 4 are integrated, and a second semiconductor chip on which the control logic circuit 1, the charge pump 2, the short-circuit MOS transistor 5, the inverter 6, the switch transistor 12, the load resistance 13, the back gate control transistor 14 are integrated.

Figure 7:
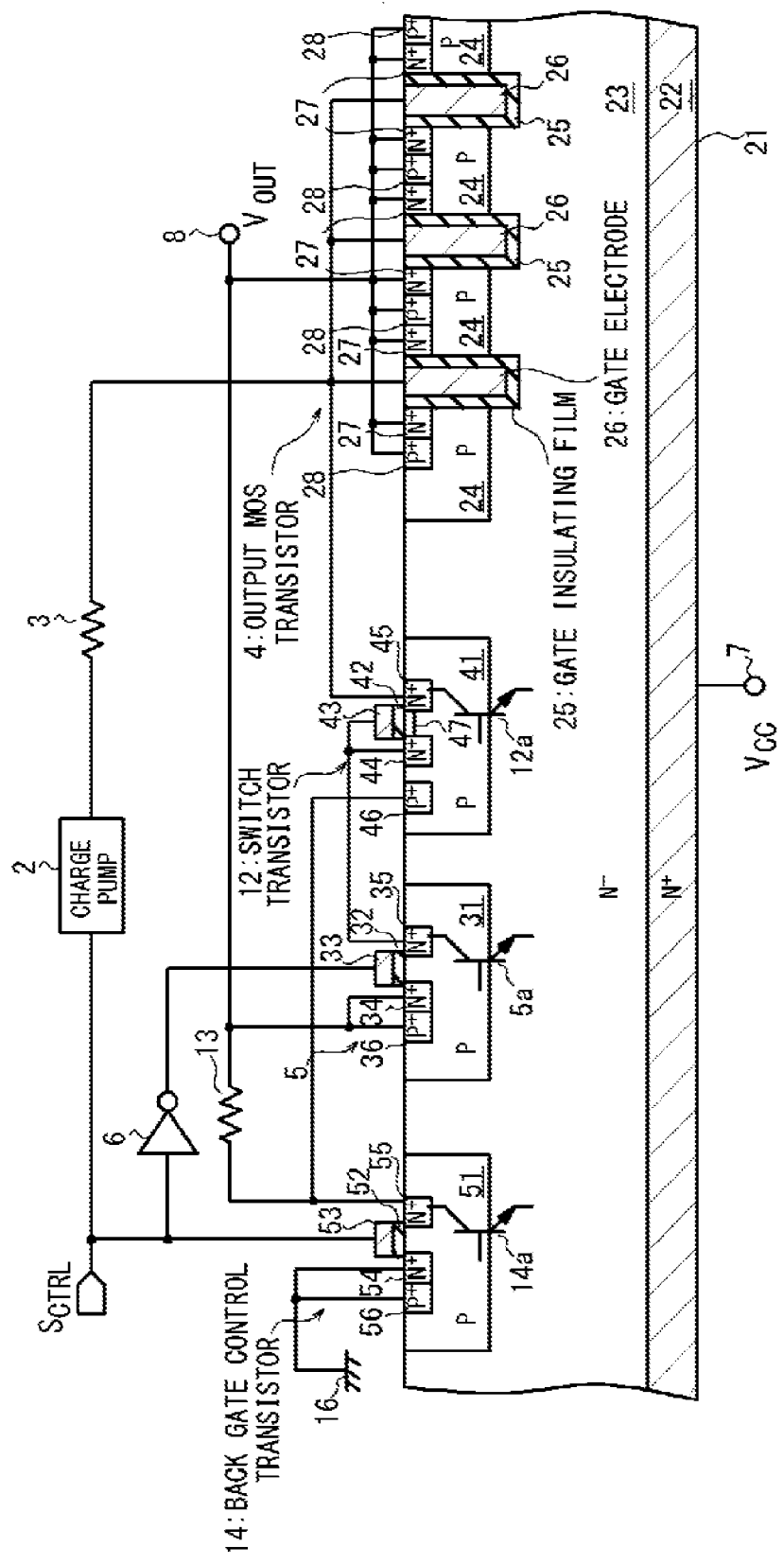
FIG. 7 is a cross section showing the configuration of the high-side driver IC in the first embodiment.

FIG. 7 is a cross section conceptually showing a sectional configuration of a portion of the high-side driver IC 10 where the output MOS transistor 4, the short-circuit MOS transistor 5, the switch transistor 12 and the back gate control transistor 14 are formed. The output MOS transistor 4, the short-circuit MOS transistor 5, the switch transistor 12 and the back gate control transistor 14 are all formed on a semiconductor substrate 21. The semiconductor substrate 21 includes an $N^+$ type substrate 22 and an $N^-$ type epitaxial layer 23 which is formed on the $N^+$ type substrate 22. The $N^+$ type semiconductor substrate 22 is heavily doped with an N-type impurity and is connected with the power supply terminal 7. The $N^+$ type substrate 22 functions as a semiconductor region in which the N-type impurity is heavily doped. The $N^-$ type epitaxial layer 23 is a semiconductor region in which the N-type impurity is doped, (that is, the conductive type of the N-type semiconductor region). The output MOS transistor 4, the short-circuit MOS transistor 5, the switch transistor 12 and the back gate control transistor 14 are formed in the surface section of the $N^-$ type epitaxial layer 23.

FIG. 7 is a cross section showing the structure when the output MOS transistor 4 is formed as an N-channel vertical-type MOSFET (MOS field effect transistor) having a trench gate structure. In detail, a P-type body region 24 is formed in the surface section of an $N^-$ type epitaxial layer 23. The P-type body region 24 is a semiconductor region in which the P-type impurity is doped (that is, the P-type semiconductor region). A trench is formed to pass through the P-type body region 24 and the gate insulating film 25 and the gate electrode 26 are formed to embed the trench. Here, the gate insulating film 25 is formed along the inner wall of the trench and the gate electrode 26 is formed to oppose to the P-type body region 24 and the $N^-$ type epitaxial layer 23 through the gate insulating film 25.

In addition, an N-type diffusion layer 27 in which the N-type impurity is heavily doped is formed in the surface section of the P-type body region 24 in the position adjacent to the gate insulating film 25. Moreover, a P-type diffusion layer 28 in which the P-type impurity is heavily doped is formed in the surface section of the P-type body region 24. In the output MOS transistor 4 of such a configuration, the N-type diffusion layer 27 functions as the source terminal and the semiconductor substrate 21 and the N type epitaxial layer 23 function as the drain terminal. Also, the P-type diffusion layer 28 functions as the back gate terminal. It should be noted that the output MOS transistor 4 is not limited to the vertical-type MOSFET having the trench gate structure, and may be a planar gate-type vertical-type MOSFET and a lateral-type MOSFET.

The short-circuit MOS transistor 5 is formed as the lateral-type N-channel MOSFET. In detail, a P-type body region 31 is formed in the surface section of the N⁻ type epitaxial layer 23. The P-type body region 31 is a semiconductor region in which the P-type impurity is doped (that is, the P-type semiconductor region). An N-type diffusion layer 34 and an N-type diffusion layer 35 are formed in the surface section of the P-type body region 31. The N-type diffusion layer 34 and the N-type diffusion layer 35 are diffusion layers in which the N-type impurity is heavily doped. A gate insulating film 32 is formed to cover a region (a channel region) between the N-type diffusion layer 34 and the N-type diffusion layer 35 in the P-type body region 31, and a gate electrode 33 is formed on the surface of the gate insulating film 32. Moreover, a P-type diffusion layer 36 which is a diffusion layer in which the P-type impurity is heavily doped is formed in the surface section of the P-type body region 31. In the short-circuit MOS transistor 5 of such a configuration, the N-type diffusion layer 34 functions as the source and the N-type diffusion layer 35 functions as the drain. Also, the P-type diffusion layer 36 functions as the back gate terminal.

The switch transistor 12 is configured from the depletion-type lateral-type N-channel MOSFET. In detail, a P-type body region 41 is formed in the surface section of the N⁻ type epitaxial layer 23. The P-type body region 41 is a semiconductor region in which the P-type impurity is doped (that is, the P-type semiconductor region). An N-type diffusion layer 44 and an N-type diffusion layer 45 are formed in the surface section of the P-type body region 41. The N-type impurity is heavily doped in the N-type diffusion layer 44 and the N-type diffusion layer 45. Moreover, an N-type channel region 47 in which the N-type impurity is doped is formed in the surface neighborhood in the P-type body region 41 in a region between the N-type diffusion layer 44 and the N-type diffusion layer 45. In the structure of the switch transistor 12 of the present embodiment, it is important for the N-type channel region 47 to make the switch transistor 12 function as a depletion-type N-channel MOSFET. A gate insulating film 42 is formed to cover the N-type channel region 47 and a gate electrode 43 is formed to oppose to the N-type channel region 47 through the gate insulating film 42. Moreover, a P-type diffusion layer 46 in which the P-type impurity is heavily doped is formed in the surface section of the P-type body region 41. In the switch transistor 12 of such a configuration, the N-type diffusion layer 44 functions as the source and the N-type diffusion layer 45 functions as the drain. Also, the P-type diffusion layer 46 functions as the back gate terminal.

The back gate control transistor 14 is configured from the lateral-type N-channel MOSFET, like the short-circuit MOS transistor 5. In detail, a P-type body region 51 is formed in the surface section of the N⁻ type epitaxial layer 23. The P-type body region 51 is a semiconductor region in which the P-type impurity is doped (that is, the P-type semiconductor region). An N-type diffusion layer 54 and an N-type diffusion layer 55 are formed in the surface section of the P-type body region 51. The N-type impurity is heavily doped into the N-type diffusion layer 54 and the N-type diffusion layer 55. A gate insulating film 52 is formed to cover a region (the channel region) between the N-type diffusion layer 54 and the N-type diffusion layer 55 in the P-type body region 51, and a gate electrode 53 is formed on the surface of the gate insulating film 52. Moreover, a P-type diffusion layer 56 in which the P-type impurity is heavily doped is formed in the surface section of the P-type body region 51. In the back gate control transistor 14 of such a configuration, the N-type diffusion layer 54 functions as the source terminal and the N-type diffusion layer 55 functions as the drain terminal. Also, the P-type diffusion layer 56 functions as the back gate terminal.

Note that parasitic bipolar transistors 5a, 12a and 14a are formed in the short-circuit MOS transistors 5, the switch transistor 12 and the back gate control transistor 14 in the configuration shown in FIG. 7. That is, the N⁻ type epitaxial layer 23 functions as emitters of the parasitic bipolar transistors 5a, 12a and 14a, the P-type body regions 31, 41 and 51 function as bases thereof and the N-type diffusion layers 35, 45 and 55 function as collectors, respectively.

However, in the high-side driver IC 10 of the present embodiment, any of the parasitic bipolar transistors 5a, 12a and 14a never obstruct the operation of the high-side driver IC 10, as be considered below in detail. That is, in the high-side driver IC 10 of the present embodiment, even if the voltage $V_{OUT}$ of the output terminal 8 becomes higher than the voltage $V_{CC}$ of the power supply terminal 7 so that the parasitic bipolar transistor 5a of the short-circuit MOS transistor 5 is set to an ON state, the gate of the output MOS transistor 4 is electrically separated from the parasitic bipolar transistor 5a by the switch transistor 12. Therefore, the output MOS transistor 4 can be turned on even if the voltage $V_{OUT}$ of the output terminal 8 becomes higher than the voltage $V_{CC}$ of the power supply terminal 7.

Below, the operation of the high-side driver IC 10 of the present embodiment will be described in detail. Note that the operation of the high-side driver IC 10 when the control logic circuit 1 generates the control signal $S_{CTRL}$ with a waveform shown in the timing chart of FIG. 4 will be described.

Figure 8:
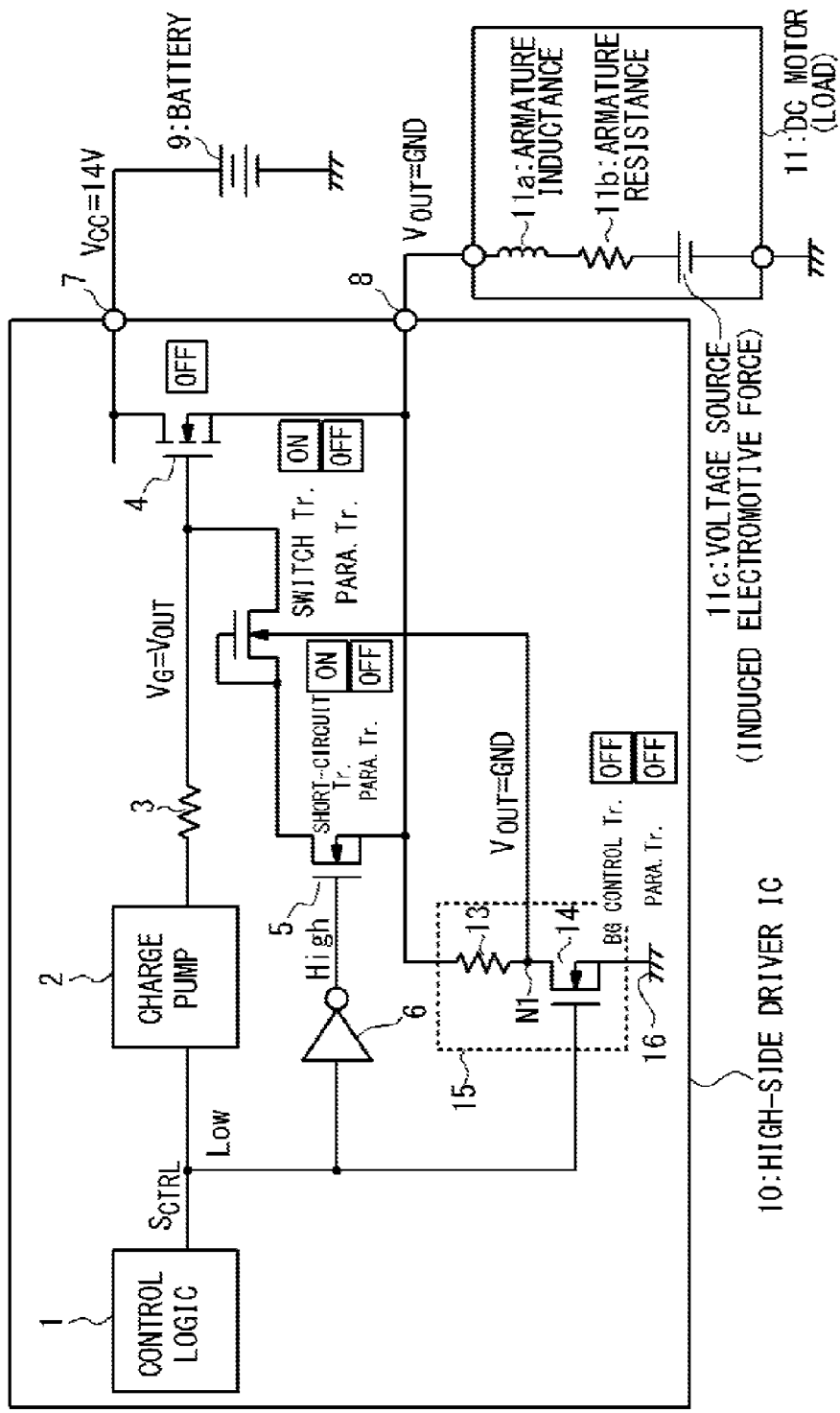
FIG. 8 is a diagram schematically showing an operation of the high-side driver IC in the period T1 in the first embodiment.
Figure 9:
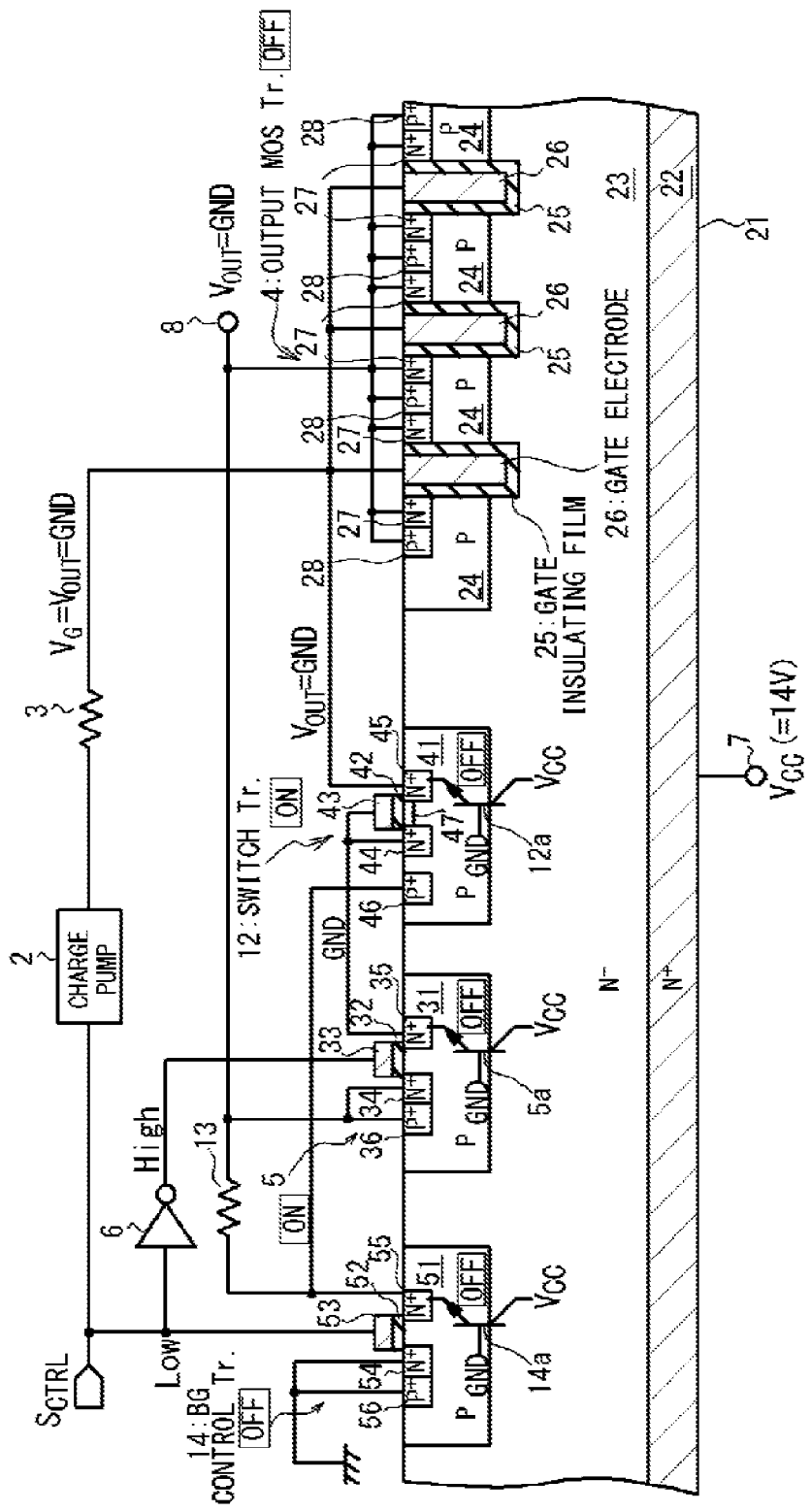
FIG. 9 is a cross section showing the state of the high-side driver IC in the period T1 in the first embodiment.

Period T1:

Referring to FIG. 4, a period T1 (time t1 to time t2) is a period for which the high-side driver IC 10 is in an initial state. In the period T1, it is supposed that the DC motor 11 is in a stop state, the voltage $V_{CC}$ of the power supply terminal 7 (the power supply voltage which is supplied to the high-side driver IC 10 from the battery 9) is 14 V, and the control signal $S_{CTRL}$ is in the low level. Because the DC motor 11 is in the stop state so that the induced electromotive force does not generate, the voltage $V_{OUT}$ of the output terminal 8 becomes the ground voltage GND. FIG. 8 is a circuit diagram showing the operation of the high-side driver IC 10 in the period T1, and FIG. 9 is a cross section showing the state of the high-side driver IC 10 in the period T1.

In the period T1, the control signal $S_{CTRL}$ is in the low level, so that the charge pump 2 does not drive the gate of the output MOS transistor 4. In addition, because the inversion signal of the control signal $S_{CTRL}$ which is outputted from the inverter 6 is in the high level, the short-circuit MOS transistor 5 is turned on.

Also, in the back gate control circuit 15, because the back gate control transistor 14 is turned off, the voltage of the back gate of the switch transistor 12 becomes the voltage $V_{OUT}$ of the output terminal 8, i.e. the ground voltage GND. Because the source and gate of the switch transistor 12 are connected with the output terminal 8 through the short-circuit MOS transistor 5. Therefore, the voltages of the source and gate of the switch transistor 12 become the voltage $V_{OUT}$ of the output terminal 8, i.e. the ground voltage GND. Therefore, the switch transistor 12 is turned on.

As a result, the gate of the output MOS transistor 4 is short-circuited with the source of the output MOS transistor 4 through the short-circuit MOS transistor 5 and the switch transistor 12 and the output MOS transistor 4 is turned off. It should be noted that the parasitic bipolar transistors 5a, 12a, and 14a of the short-circuit MOS transistor 5, the switch transistor 12, and the back gate control transistor 14 are all in the OFF state.

Figure 10:
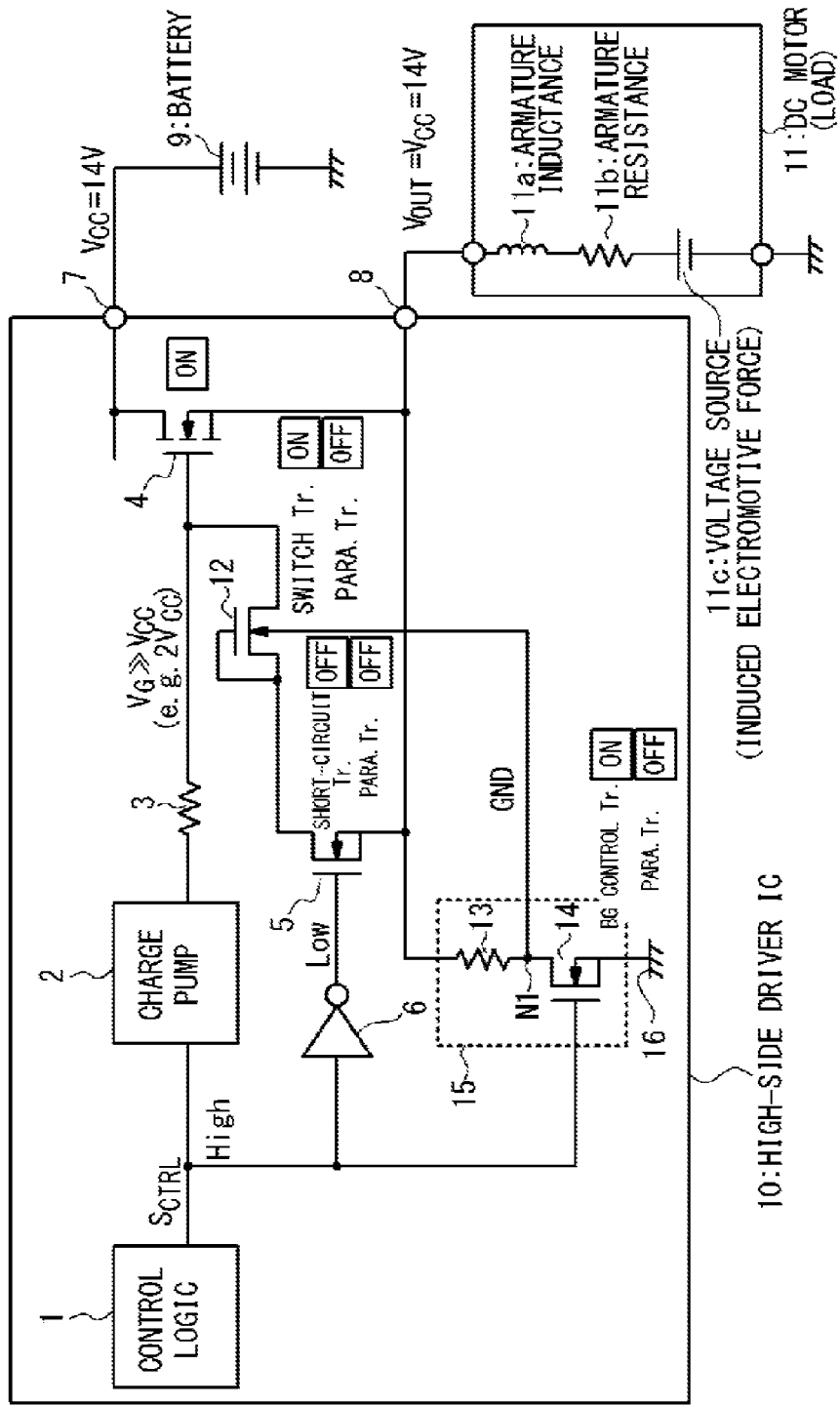
FIG. 10 is a diagram schematically showing the operation of the high-side driver IC in a period T2 in the first embodiment.
Figure 11:
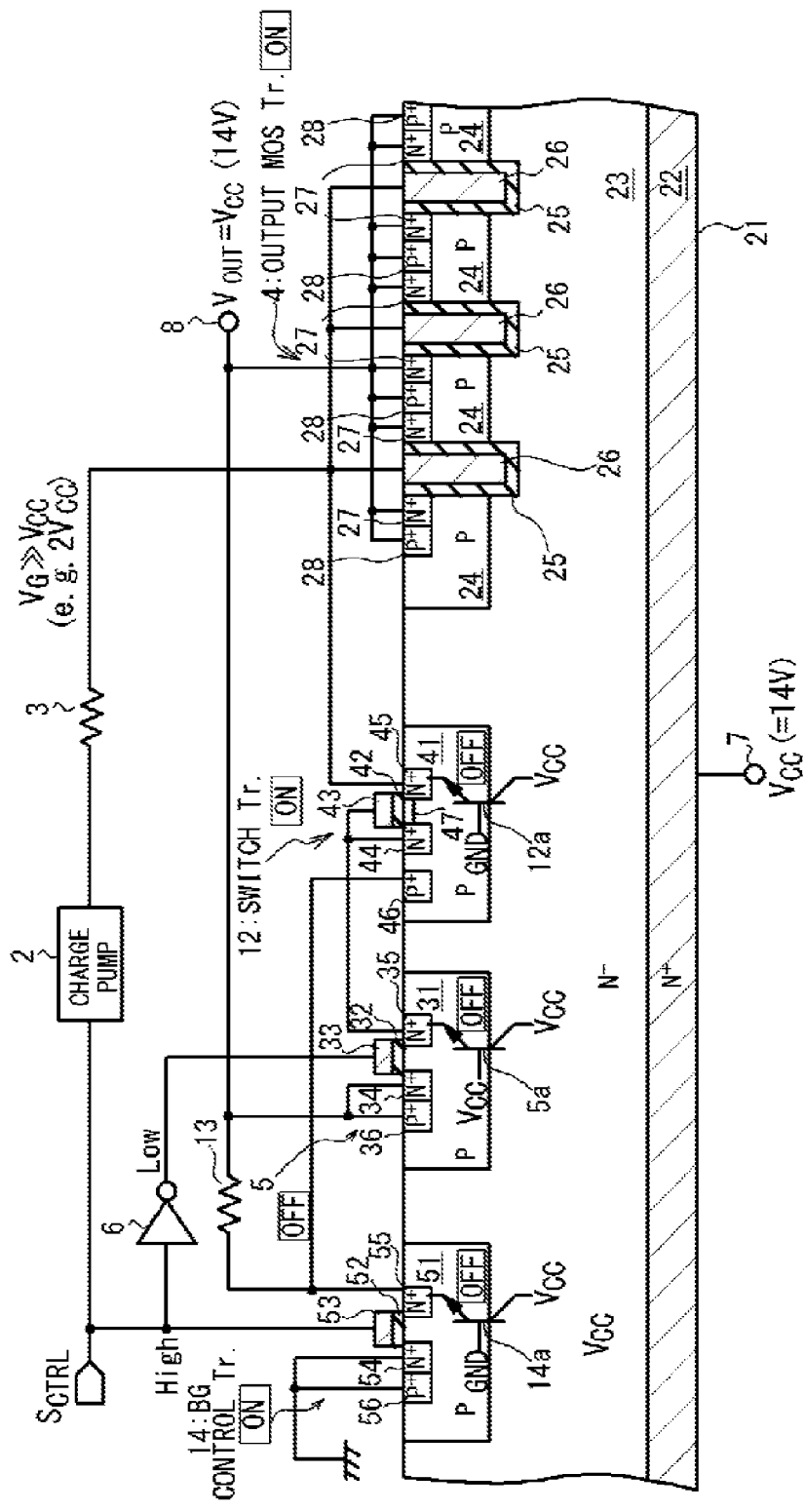
FIG. 11 is a cross section showing a state of the high-side driver IC in the period T2 in the first embodiment.

Period T2:

Referring to FIG. 4, it is supposed that the control signal $S_{CTRL}$ is pulled up from the low level to the high level by the control logic circuit 1 at a start time t2 of a period T2 (time t2 to time t4). FIG. 10 is a diagram schematically showing the operation of the high-side driver IC 10 in the period T2, and FIG. 11 is a cross section showing the state of the high-side driver IC 10 in the period T2.

At this time, the gate voltage $V_G$ of the output MOS transistor 4 is driven to a voltage which is higher than the voltage $V_{CC}$ of the power supply terminal 7 (Typically, $2V_{CC}$) by the charge pump 2 so that the output MOS transistor 4 is turned on. At this time, the voltage $V_{OUT}$ of the output terminal 8 is pulled up to the power supply voltage (14V) which is supplied from the battery 9, i.e. the voltage $V_{CC}$ of the power supply terminal 7 (Time t3). The supply of power to the DC motor 11 is started from the battery 9. Also, because the inversion signal of the control signal $S_{CTRL}$ outputted from the inverter 6 is in the low level, the short-circuit MOS transistor 5 is turned off.

Also, the voltage of the P-type body region 31 of the short-circuit MOS transistor 5 becomes the voltage $V_{OUT}$ of the output terminal 8, i.e. the voltage $V_{CC}$. Moreover, the voltage of the N⁻ type epitaxial layer 23 is the voltage $V_{CC}$. Therefore, the parasitic bipolar transistor 5a is turned off. Note that the P-type body region 31 functions as the base of the NPN-type parasitic bipolar transistor 5a, and the N⁻ type epitaxial layer 23 functions as the emitter. Therefore, the problem does not occur that the gate voltage of the output MOS transistor 4 falls down due to the parasitic bipolar transistor 5a.

Also, in the back gate control circuit 15, because the back gate control transistor 14 is turned on in response to the control signal $S_{CTRL}$ in the high level, the voltage of the back gate of the switch transistor 12 becomes the ground voltage GND. On the other hand, because the short-circuit MOS transistor 5 and the parasitic bipolar transistor 5a are turned off, the gate and source of the switch transistor 12 become a floating state. As a result, the switch transistor 12 maintains the ON state. Note that the switch transistor 12 is normally on. At this time, as shown in FIG. 11, the voltages of the P-type body regions 41 and 51 of the switch transistor 12 and the back gate control transistor 14, i.e. the voltages of the bases of the parasitic bipolar transistors 12a and 14a are the ground voltage GND, so that the parasitic bipolar transistors 12a and 14a become the OFF state.

Figure 12:
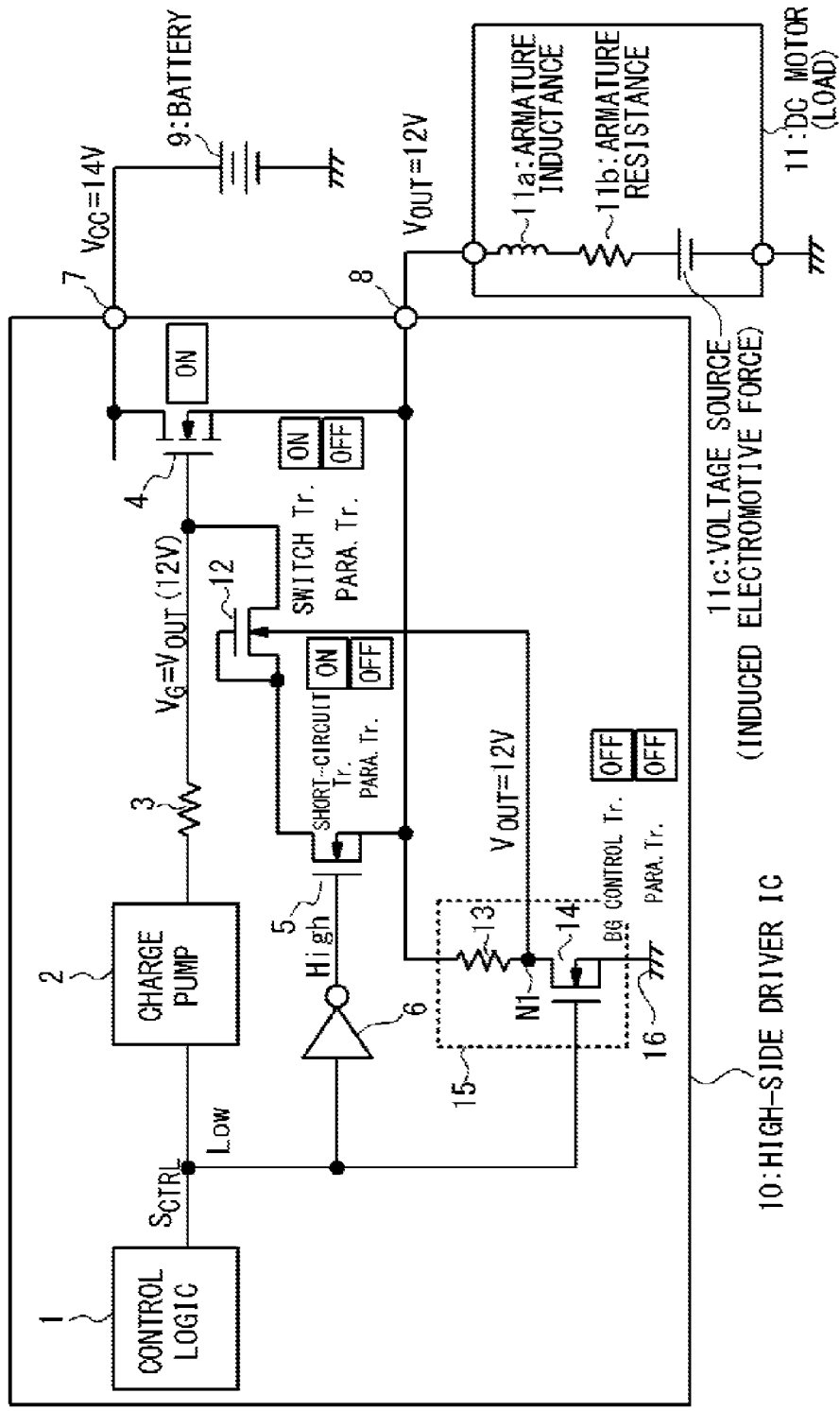
FIG. 12 is a diagram schematically showing an operation of the high-side driver IC in a period T3 in the first embodiment.
Figure 13:
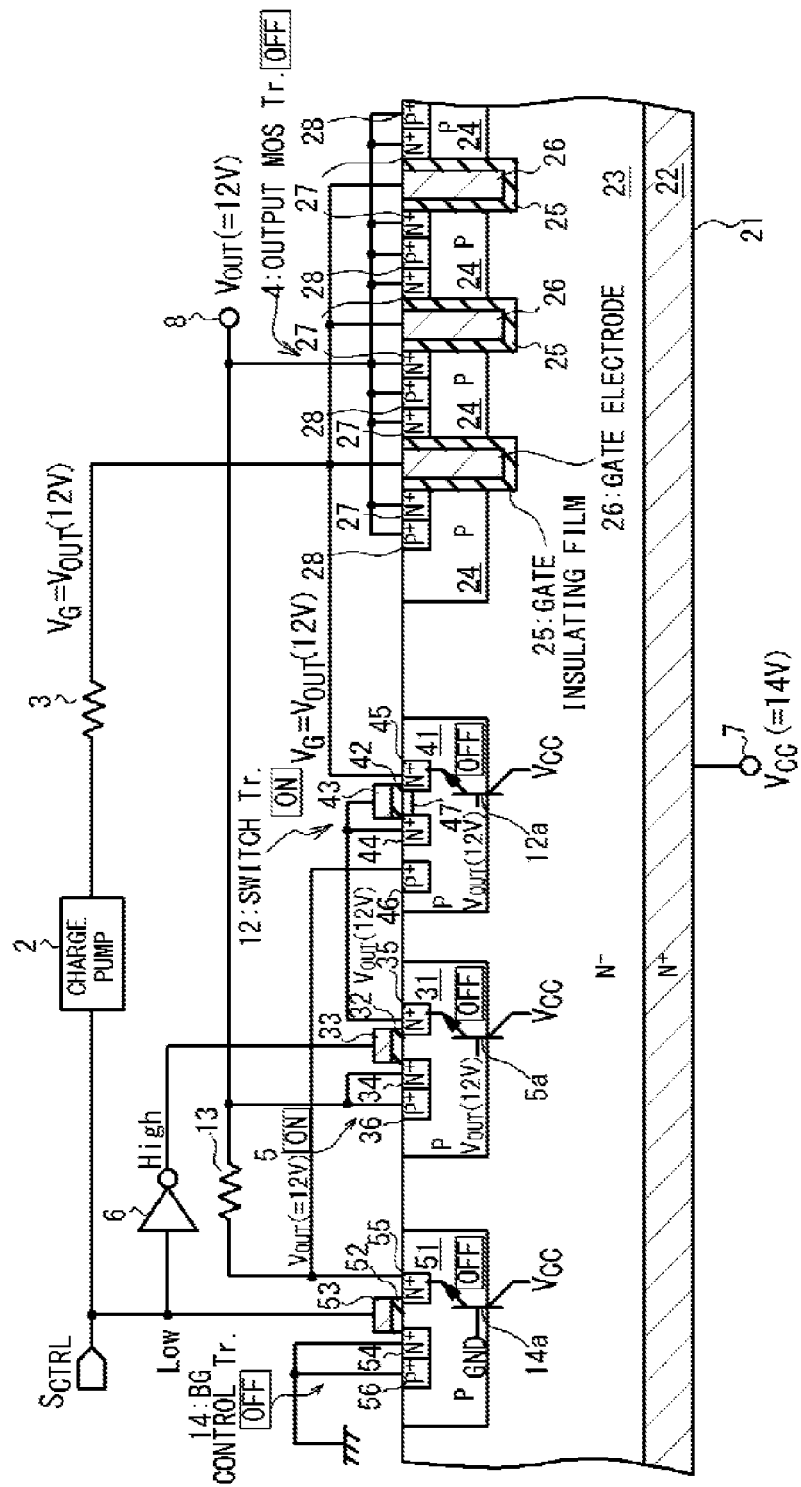
FIG. 13 is a cross section showing a state of the high-side driver IC in the period T3 in the first embodiment.

Period T3:

After that, it is supposed that the control signal $S_{CTRL}$ is pulled down from the high level to the low level in a start time t4 of a period T3 (time t4 to time t6), as shown in FIG. 4. FIG. 12 is a diagram schematically showing the operation of the high-side driver IC 10 in the period T3, and FIG. 13 is a cross section showing the state of the high-side driver IC 10 in the period T3.

The charge pump 2 stops the drive of the gate of the output MOS transistor 4 in response to the event that the control signal $S_{CTRL}$ is pulled down to the low level. On the other hand, because the inversion signal of the control signal $S_{CTRL}$ outputted from the inverter 6 is in the high level, the short-circuit MOS transistor 5 is turned on.

Also, because the back gate control transistor 14 is turned off, the voltage of the back gate of the switch transistor 12 becomes the voltage $V_{OUT}$ of the output terminal 8. Also, because the short-circuit MOS transistor 5 is turned on, the voltages of the source and gate of the switch transistor 12 become the voltage $V_{OUT}$ of the output terminal 8. As a result, the switch transistor 12 is turned on. At this time, the gate of the output MOS transistor 4 is connected to the source of the output MOS transistor 4 through the short-circuit MOS transistor 5 and the switch transistor 12, and the output MOS transistor 4 is turned off.

In this case, when the rotor of the DC motor 11 continues to rotate due to the inertia, a voltage is generated in the armature due to the induced electromotive force and is applied to the output terminal 8. When the voltage $V_{OUT}$ of the output terminal 8 becomes 12 V due to the induced electromotive force as shown in FIG. 4, the gate voltage $V_G$ of the output MOS transistor 4 also becomes 12 V as shown in FIG. 12 and FIG. 13.

At this time, as shown in FIG. 13, the voltages of the P-type body regions 31 and 41 of the short-circuit MOS transistor 5 and the switch transistor 12 are the voltage $V_{OUT}$ (12V) of the output terminal 8, and the voltage of the P-type body region 51 of the back gate control transistor 14 is the ground voltage GND. Therefore, the parasitic bipolar transistors 5a, 12a and 14a become the OFF state.

Figure 14:
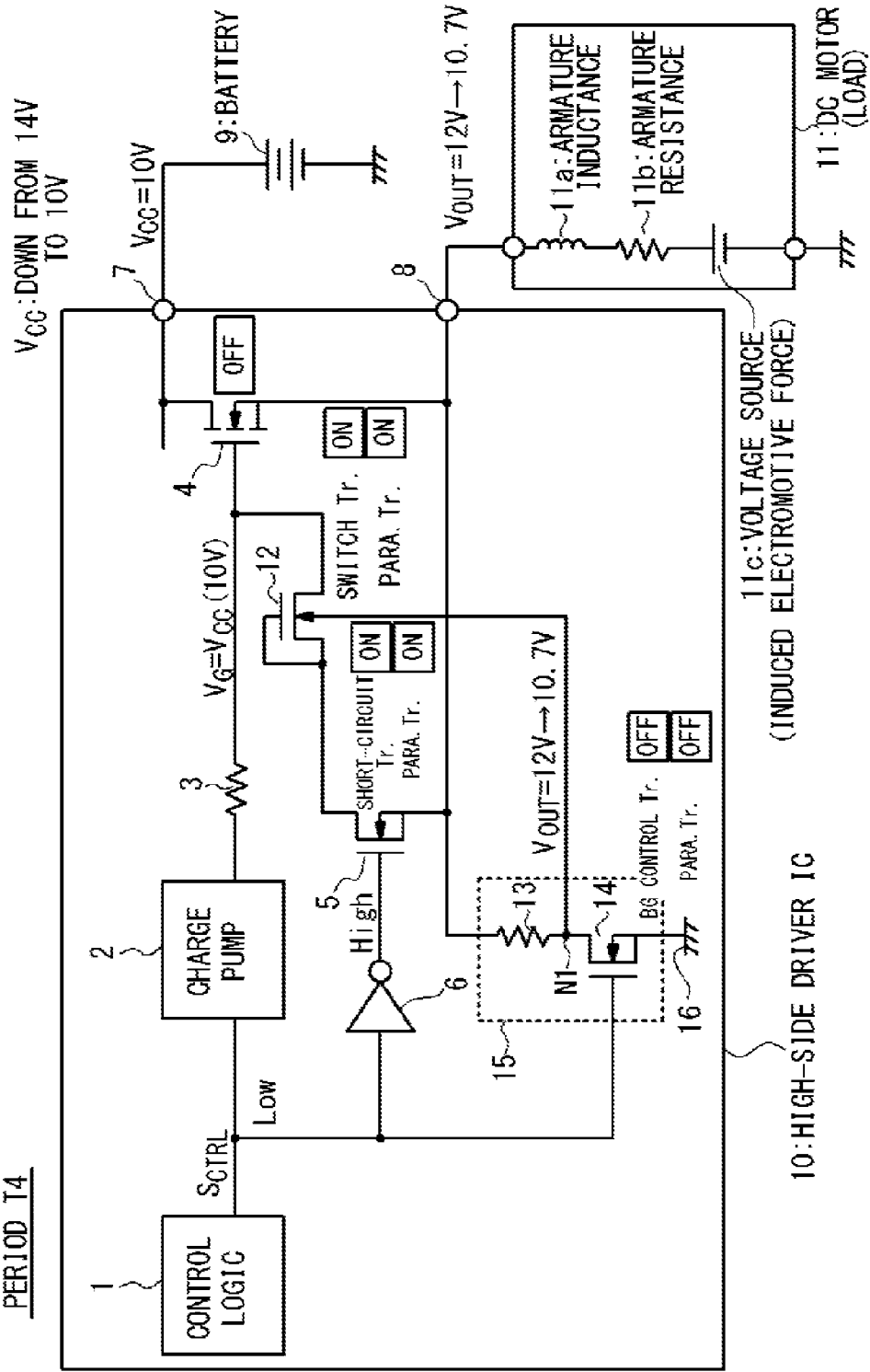
FIG. 14 is a diagram schematically showing an operation of the high-side driver IC in a period T4 in the first embodiment.
Figure 15:
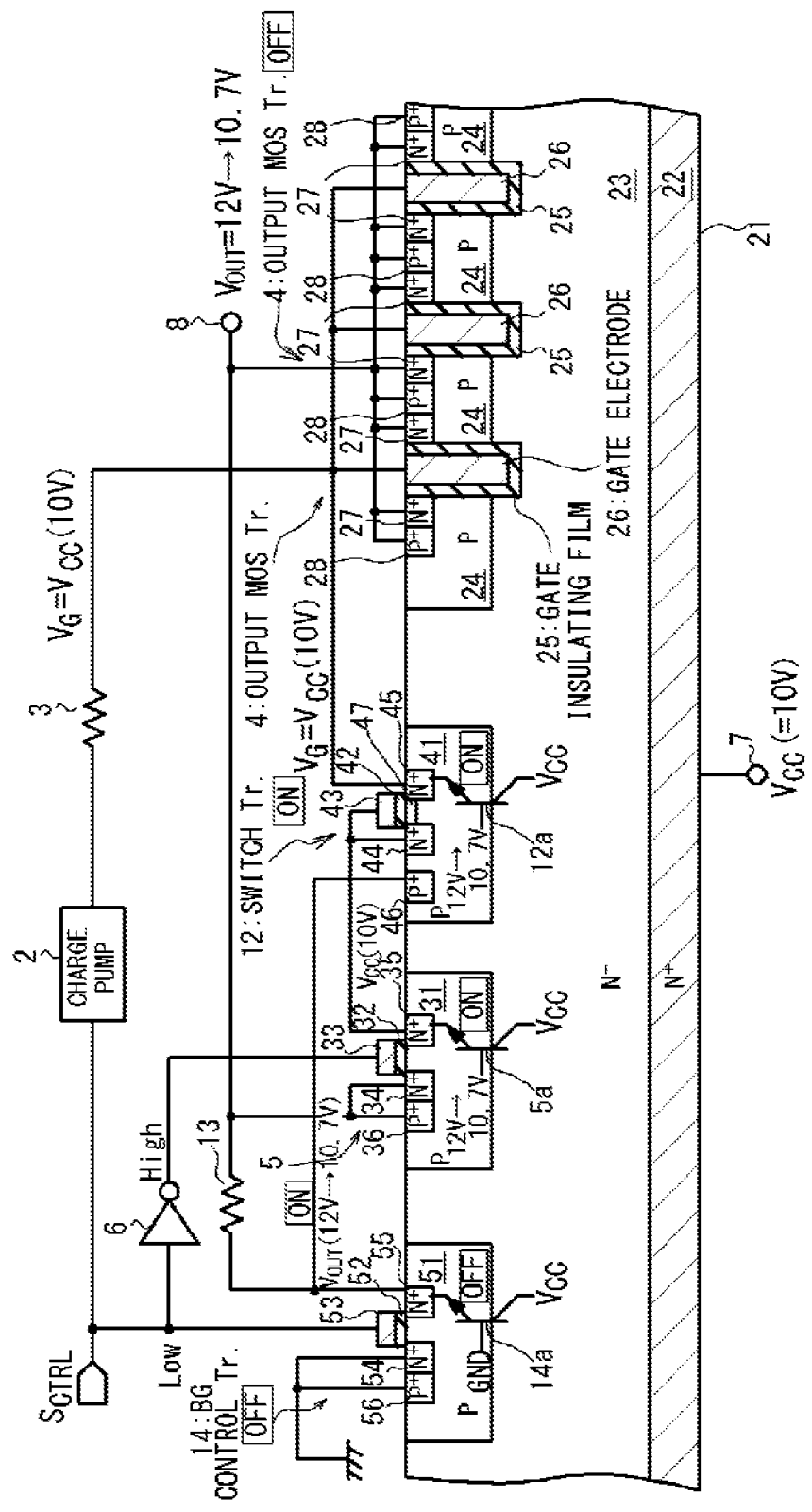
FIG. 15 is a cross section showing a state of the high-side driver IC in the period T4 in the first embodiment.

Period T4:

After that, as shown in FIG. 4, it is supposed that the voltage of the battery 9 starts to fall down from a start time t6 of a period T4 (time t6 to time t8) and reaches 10 V at a time t7. FIG. 14 is a diagram schematically showing the operation of the high-side driver IC 10 at the time t7, and FIG. 15 is a cross section showing the state of the high-side driver IC 10 at the time t7. At this time, because the control signal $S_{CTRL}$ is left in the state pulled down to the low level, the short-circuit MOS transistor 5 and the switch transistor 12 maintain the ON state. Therefore, the source and gate of the output MOS transistor 4 are connected and the output MOS transistor 4 also maintains the OFF state.

On the other hand, as shown in FIG. 14 and FIG. 15, when the voltage of the battery 9, i.e. the voltage $V_{CC}$ of the power supply terminal 7 falls down so that the voltage $V_{OUT}$ of the output terminal 8 becomes higher than a summation of the voltage $V_{CC}$ of the power supply terminal 7 and the forward voltage $V_F$ of the PN junction (about 0.7 V in case of the N⁻ type epitaxial layer 23 of silicon), the parasitic bipolar transistors 5a and 12a of the short-circuit MOS transistor 5 and the switch transistor 12 become the ON state. Note that the voltages of the P-type body region 31 and 41 of the short-circuit MOS transistor 5 and the switch transistor 12 are coincident with the voltage $V_{OUT}$ of the output terminal 8, and the voltage of the N⁻ type epitaxial layer 23 is coincident with the voltage $V_{CC}$ of the power supply terminal 7. Especially, when the parasitic bipolar transistors 5a and 12a become the ON state, the voltages of the P-type body regions 31 and 41 fall down to the summation of the voltage $V_{CC}$ of the power supply terminal 7 and the forward voltage $V_F$ of the PN junction, i.e. 10.7 V, and the voltage $V_{OUT}$ of the output terminal 8 also falls down to 10.7 V. At this time, because the short-circuit MOS transistor 5 and the switch transistor 12 are turned on so that the source and the gate in the output MOS transistor 4 are connected, the gate voltage of the output MOS transistor 4 also falls down to 10.7 V.

However, there is no influence by the parasitic bipolar transistors 5a and 12a being turned on, because the control signal $S_{CTRL}$ is in the low level and it is originally expected that the output MOS transistor 4 is in the OFF state.

Figure 16:
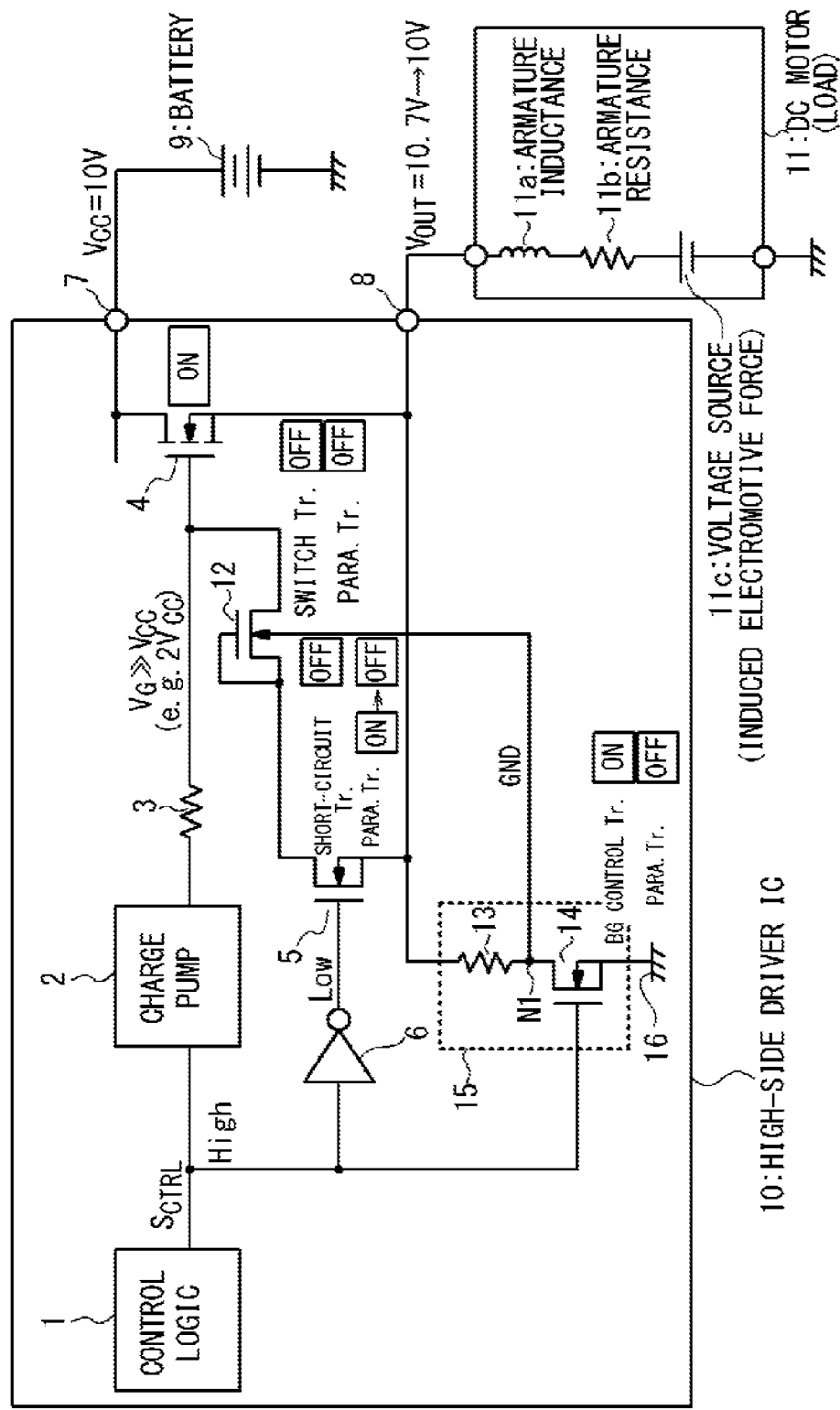
FIG. 16 is a diagram schematically showing an operation of the high-side driver IC in a period T5 in the first embodiment.
Figure 17:
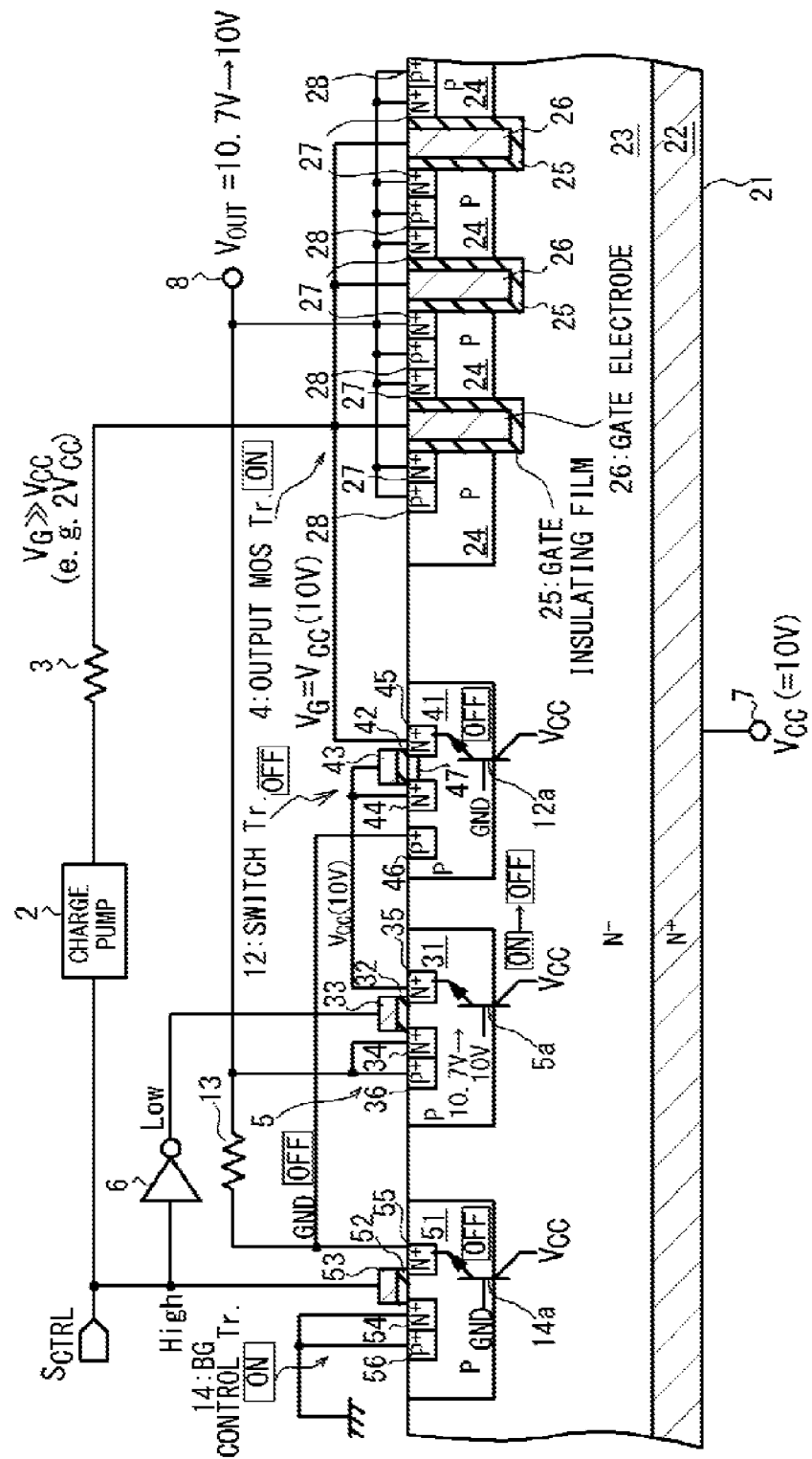
FIG. 17 is a cross section showing a state of the high-side driver IC in the period T5 in the first embodiment.

Period T5:

In this state, as shown in FIG. 4, it is supposed that the control signal $S_{CTRL}$ is pulled up from the low level to the high level in a start time t8 of a period T5 (since time t8). FIG. 16 is a diagram schematically showing the operation of the high-side driver IC 10 in the period T5, and FIG. 17 is a cross section showing the state of the high-side driver IC 10 in the period T5. As considered below, in the high-side driver IC 10 of the present embodiment, it is important in the period T5 that the switch transistor 12 is turned off, the parasitic bipolar transistor 12a is turned off, and the gate of the output MOS transistor 4 can be driven to a high voltage (specifically, about $2V_{CC}$) by the charge pump 2.

In detail, the gate voltage $V_G$ of the output MOS transistor 4 is driven to a voltage (typically, $2V_{CC}$) which is higher than the voltage $V_{CC}$ of the power supply terminal 7 by the charge pump 2 in response to the control signal $S_{CTRL}$ pulled up to the high level. Also, because the inversion signal of the control signal $S_{CTRL}$ outputted from the inverter 6 is in the low level, the short-circuit MOS transistor 5 is turned off.

However, the parasitic bipolar transistor 5a of the short-circuit MOS transistor 5 becomes the ON state. In detail, the voltage of the P-type body region 31 of the short-circuit MOS transistor 5 becomes equal to the voltage $V_{OUT}$ of the output terminal 8 (i.e. 12 V). Moreover, the voltage of the N⁻ type epitaxial layer 23 becomes equal to the voltage $V_{CC}$ (i.e. 10 V). Therefore, the voltage of the base of the parasitic bipolar transistor 5a becomes higher than a summation of the voltage of the emitter and the forward voltage $V_F$. Thus, the parasitic bipolar transistor 5a is turned on. When the parasitic bipolar transistor 5a become the ON state, the voltages of the source and the gate in the switch transistor 12 become the voltage $V_{CC}$ (i.e. 10 V).

In the back gate control circuit 15 of the present embodiment, the back gate control transistor 14 is turned on in response to the control signal $S_{CTRL}$ in the high level, so that the voltage of the back gate of the switch transistor 12, i.e. the P-type body region 41 becomes equal to the ground voltage GND. Therefore, an inverse bias is applied between the N-type diffusion layer 44 of the switch transistor 12 and the P-type body region 41 so that the switch transistor 12 is turned off. Also, regarding the parasitic bipolar transistor 12a of the switch transistor 12, because the voltage of the P-type body region 41 functioning as the base becomes lower than the voltage of the N⁻ type epitaxial layer 23 functioning as the emitter, the parasitic bipolar transistor 12a is turned off.

As a result, even when the parasitic bipolar transistor 5a of the short-circuit MOS transistor 5 become the ON state, the gate of the output MOS transistor 4 can be driven to the high voltage so that the output MOS transistor 4 can be turned on. As a result, the voltage $V_{OUT}$ of the output terminal 8 becomes the power supply voltage supplied from the battery 9, i.e. the voltage (10 V) which is identical with the voltage $V_{CC}$ of the power supply terminal 7.

Note that the voltage of the P-type body region 31 of the short-circuit MOS transistor 5 becomes equal to the voltage which is identical with the voltage $V_{CC}$ of the power supply terminal 7, after the voltage $V_{OUT}$ of the output terminal 8 becomes equal to the voltage (10 V) which is identical with the voltage $V_{CC}$ of the power supply terminal 7. Thus, the parasitic bipolar transistor 5a returns to the OFF state. Note that the gate of the output MOS transistor 4 can be driven to a high voltage even after the parasitic bipolar transistor 5a becomes the OFF state.

As described above, in the high-side driver IC 10 of the present embodiment, it is possible to avoid the problem that the parasitic bipolar transistor 5a of the short-circuit MOS transistor 5 becomes active when the voltage of the battery 9 falls down so that the voltage $V_{CC}$ of the power supply terminal 7 becomes lower than the voltage $V_{OUT}$ of the output terminal 8. In detail, if the control signal $S_{CTRL}$ is pulled up to the high level when the voltage $V_{CC}$ of the power supply terminal 7 becomes lower than the voltage $V_{OUT}$ of the output terminal 8, the switch transistor 12 is turned off through the operation of the back gate control circuit 15 and the parasitic bipolar transistor 12a is turned off. Therefore, even if the parasitic bipolar transistor 5a of the short-circuit MOS transistor 5 is turned on due to the reduction of the voltage $V_{CC}$ of the power supply terminal 7, the gate of the output MOS transistor 4 is electrically separated from the short-circuit MOS transistor 5. Therefore, it is possible to drive the gate of the output MOS transistor 4 to a high voltage and to set the output MOS transistor 4 to the ON state.

Note that although a depletion-type N-channel MOS transistor is used as the switch transistor 12 in the above-mentioned embodiments, the switching device having another structure and satisfying the following conditions may be used instead of the switch transistor 12:

(1) to have a semiconductor region formed in the semiconductor substrate which is connected with the battery 9 (i.e. the power supply);

(2) to have a diffusion layer (a region heavily doped with impurity) connected with the drain of the short-circuit MOS transistor 5 and a diffusion layer connected with the gate of the output MOS transistor 4, which diffusion layers are formed in the semiconductor region; and (3) to have a function of electrically connecting and disconnecting between the drain of the short-circuit MOS transistor 5 and the gate of the output MOS transistor 4 by controlling the voltage of the semiconductor region by the back gate control circuit 15.

Figure 18:
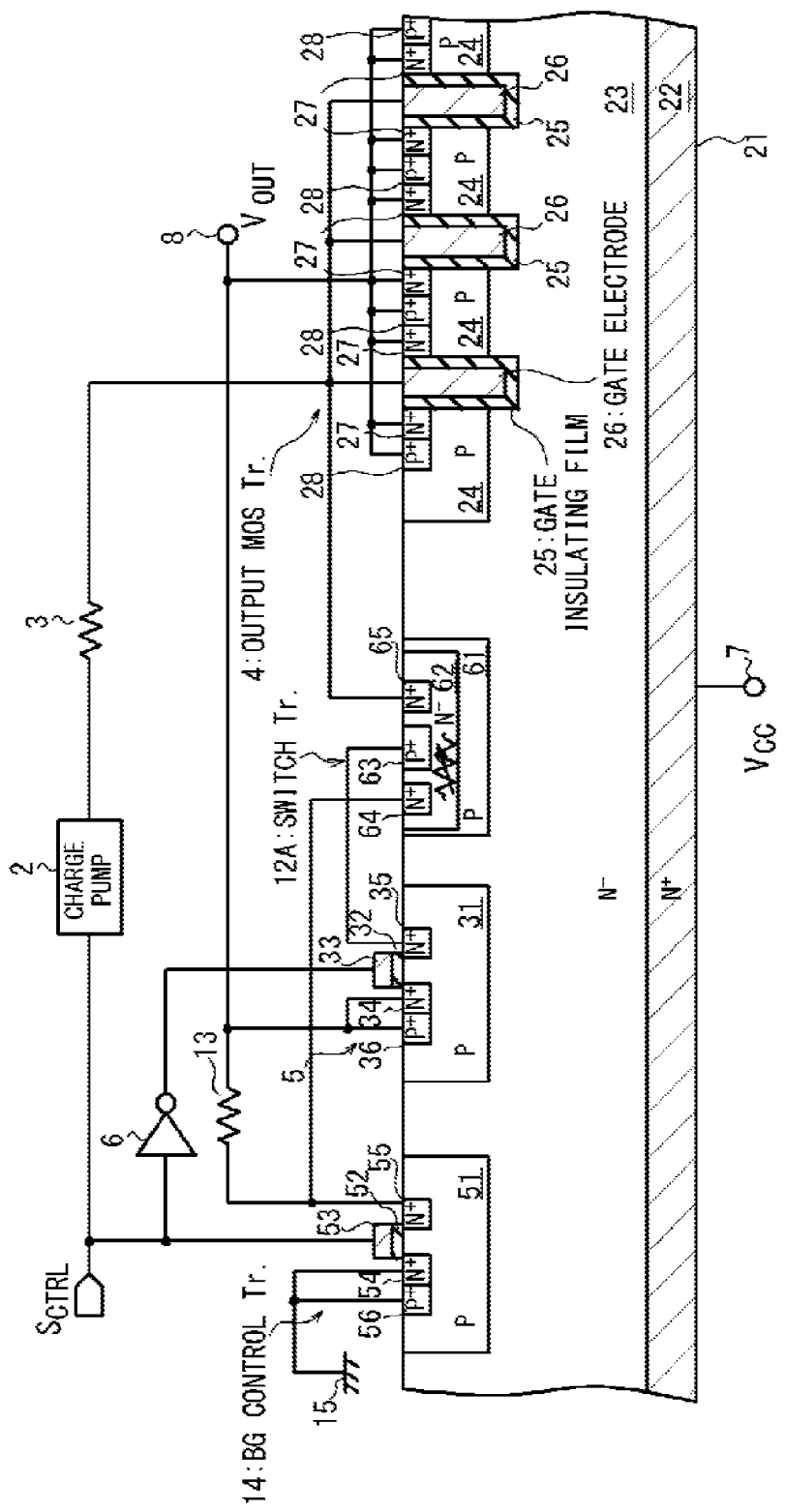
FIG. 18 is a cross section showing the configuration of the high-side driver IC which uses a switch transistor configured as JFET.

FIG. 18 is a cross section showing another example of the switching device having the structure which satisfies the above-mentioned conditions (1) to (3). FIG. 18 shows an example in which a JFET (junction field effect transistor) is used as the switch transistor (referred by 12A in FIG. 18) connected between the drain of the short-circuit MOS transistor 5 and the gate of the output MOS transistor 4. Note that the JFET is a normally turned on transistor. In detail, a P-type semiconductor region 61 doped with the P-type impurity in the surface section of the N⁻ type epitaxial layer 23 is formed and an N-type body region 62 doped with the N-type impurity is formed the inside thereof. The P-type diffusion layer 63 heavily doped with the P-type impurity and the N-type diffusion layers 64 and 65 heavily doped with the N-type impurity are formed in the surface section of the N-type body region 62. In the switch transistor 12A having such a structure, the P-type diffusion layer 63 functions as the gate terminal, the N-type diffusion layer 64 functions as the source terminal and the N-type diffusion layer 65 functions as the drain terminal.

In the configuration of FIG. 18, also, the switch transistor 12A can operate in the same way as the above-mentioned switch transistor 12, by controlling the voltage of the N-type diffusion layer 64 of the switch transistor 12A, i.e. the voltage of the N-type body region 62 by the back gate control circuit 15 which includes the load resistance 13 and the back gate control transistor 14. That is, in detail, when the voltage $V_{CC}$ of the power supply terminal 7 becomes lower than the voltage $V_{OUT}$ of the output terminal 8, the control signal $S_{CTRL}$ is pulled up to the high level, and the switch transistor 12A is turned off through the operation of the back gate control circuit 15. Therefore, even if the parasitic bipolar transistor 5a of the short-circuit MOS transistor 5 is turned on through the falling-down of the voltage $V_{CC}$ of the power supply terminal 7, the gate of the output MOS transistor 4 is electrically disconnected from the short-circuit MOS transistor 5. Therefore, it is possible to drive the gate of the output MOS transistor 4 to a high voltage and to set the output MOS transistor 4 to the ON state.

An example which the output MOS transistor 4, the short-circuit MOS transistor 5, the switch transistor (12 or 12 A) and the back gate control transistor 14 are integrated monolithically (i.e. on an identical semiconductor substrate) is shown in FIG. 7, FIG. 9, FIG. 11, FIG. 13, FIG. 15, FIG. 17, and FIG. 18. However, as described later in detail, the semiconductor device of the present embodiment may be realized as a semiconductor device of a multi-chip configuration including a semiconductor chip on which the output MOS transistor 4 is formed, and a semiconductor chip on which a switch transistor (12 or 12 A) and the back gate control transistor 14 are integrated.

Second Embodiment

Figure 19:
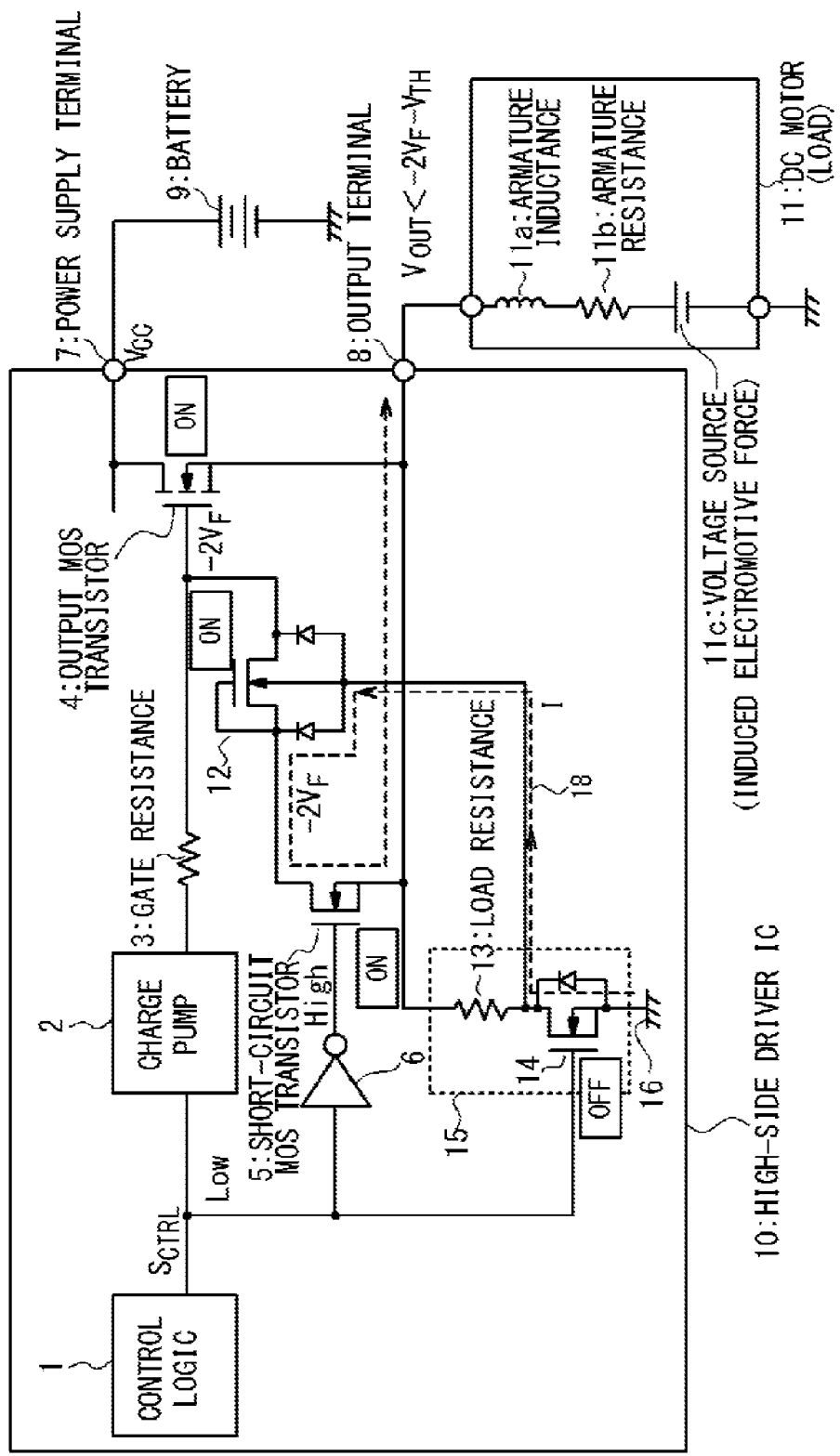
FIG. 19 is a diagram schematically showing phenomena which would occur in case of the output terminal of a negative voltage, in the high-side driver IC of the first embodiment.

In the high-side driver IC 10 of the first embodiment in which a depletion-type N-channel MOS transistor is used as the switch transistor 12, there is one problem in that there is a possibility that the output MOS transistor 4 turns on even if the control signal $S_{CTRL}$ is in the low level, when the voltage $V_{OUT}$ of the output terminal 8 is a negative voltage. Note that it is expected that the output MOS transistor 4 is in the off state if the control signal $S_{CTRL}$ is in the low level. FIG. 19 is a diagram for describing this problem.

A body diode is formed in the back gate control transistor 14 as the N-channel MOS transistor so that a forward current can flow from the source to the drain. Also, in the switch transistor 12, a parasitic diode is formed so that a forward current can flow from the back gate to the source, and also a parasitic diode is formed so that a forward current can flow from the back gate to the drain. Therefore, when the voltage $V_{OUT}$ of the output terminal 8 becomes lower than $-2V_F$ (Here, $V_F$ is the forward voltage of the diode), the current flows in the route shown by the arrow 18 of FIG. 19, i.e. in the route from the ground terminal 16 to the output terminal 8 through the back gate control transistor 14, the switch transistor 12, the short-circuit MOS transistor 5. At this time, because the switch transistor 12 is in the ON state, the voltage of the gate of the output MOS transistor 4 becomes equal to the voltage of the source of the switch transistor 12, i.e. $-2V_F$.

Here, when the voltage $V_{OUT}$ of the output terminal 8 is lower than $-2V_F-V_{TH}$ ($V_{TH}$ is the threshold voltage of the output MOS transistor 4), the source-gate voltage of the output MOS transistor 4 becomes higher than the threshold value voltage $V_{TH}$ so that the output MOS transistor 4 turns on. In the second embodiment, the configuration of a high-side driver IC 10A to cope with such a problem is shown.

Figure 20:
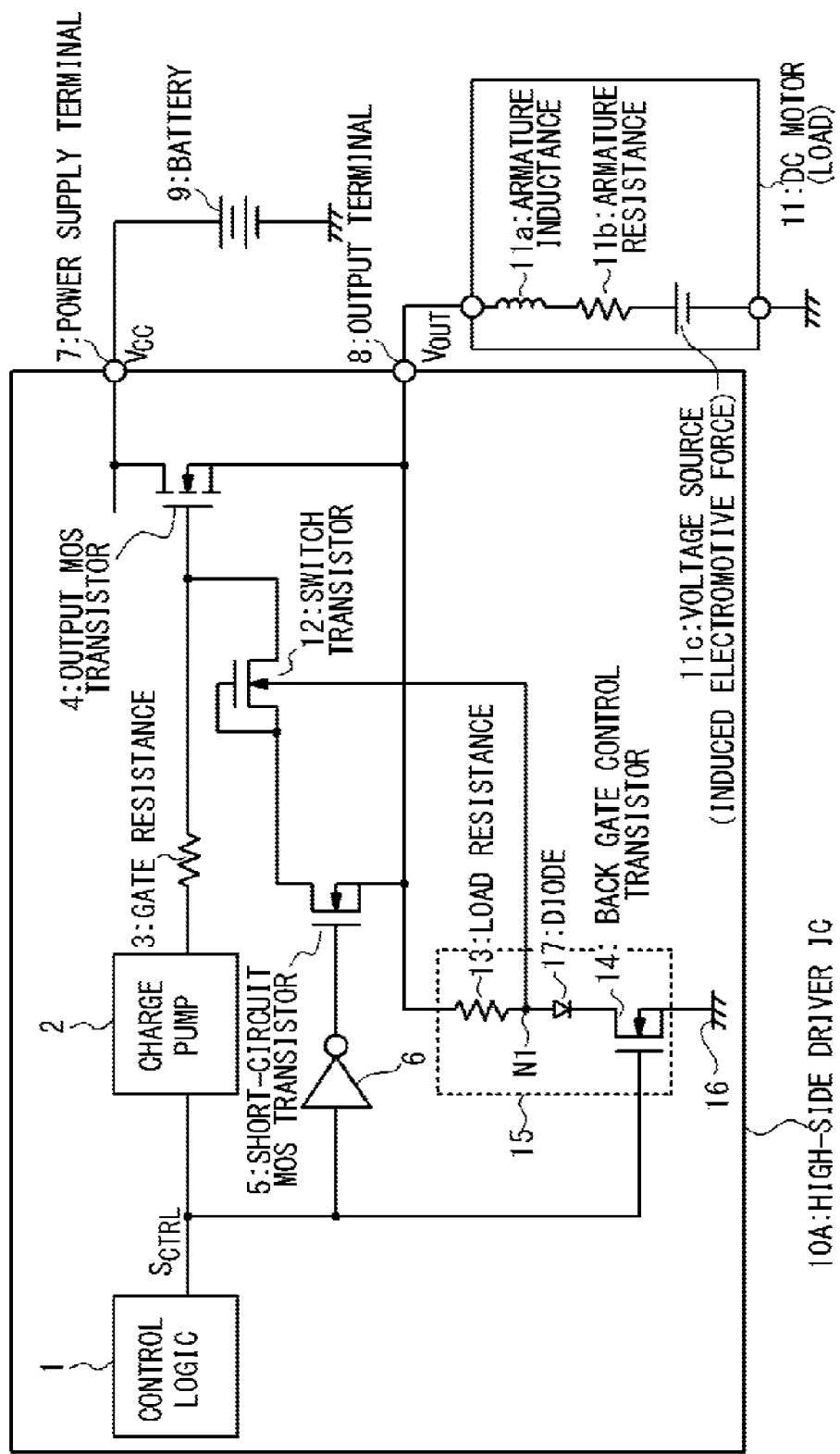
FIG. 20 is a diagram schematically showing the configuration of the high-side driver IC in a second embodiment.

FIG. 20 is a diagram schematically showing the configuration of the high-side driver IC 10A of the second embodiment. In the second embodiment, a diode 17 is connected in series with the back gate control transistor 14 between a connection node N1 (a node connected with the back gate of the switch transistor 12) and the ground terminal 16. The diode 17 is connected to prevent the current from the ground terminal 16 toward the connection node N1 (i.e. a direction from the ground terminal 16 to the connection node N1 is a reverse direction of the diode 17). More specifically, in the configuration of FIG. 20, the anode of the diode 17 is connected with the connection node N1 and the cathode thereof is connected with the drain of the back gate control transistor 14.

According to such a configuration, it is possible to prevent the current which flows through the route from the ground terminal 16 to the output terminal 8 through the back gate control transistor 14, the switch transistor 12, the short-circuit MOS transistor 5, as shown in FIG. 19. Therefore, according to the configuration of the high-side driver IC 10A of the present embodiment, when the voltage $V_{OUT}$ of the output terminal 8 is a negative voltage, it is possible to solve the problem that there is a possibility that the output MOS transistor 4 turns on even if the control signal $S_{CTRL}$ is in the low level.

Note that the positions of the back gate control transistor 14 and the diode 17 may be exchanged. In such a case, the drain of the back gate control transistor 14 is connected with the connection node N1, the source thereof is connected with the anode of the diode 17 and the cathode thereof is connected with the ground terminal 16.

Figure 21:
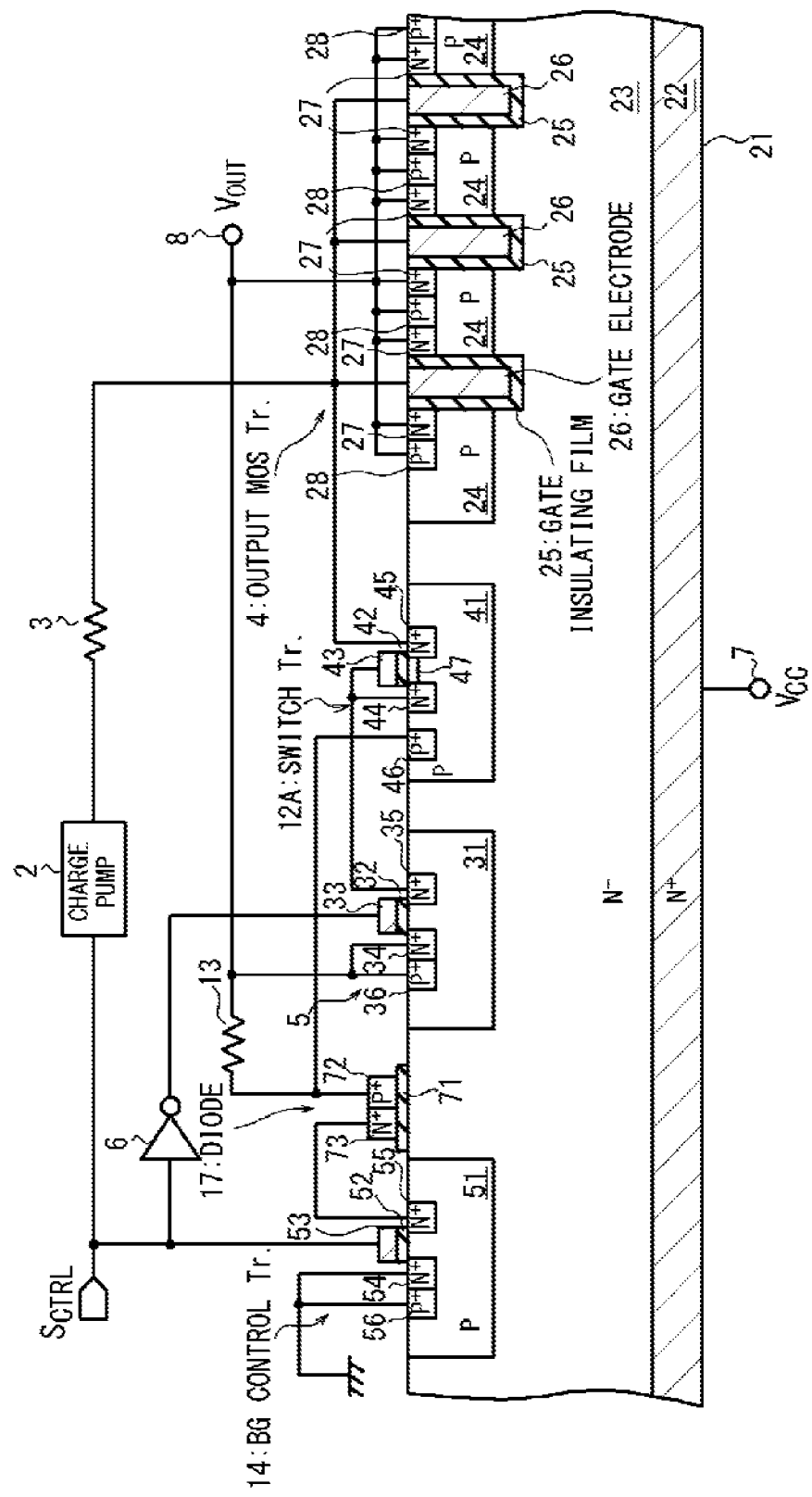
FIG. 21 is a cross section showing the configuration of the high-side driver IC in the second embodiment.

As shown in FIG. 21, the diode 17 may be integrated on the semiconductor substrate 21 together with the output MOS transistor 4, the short-circuit MOS transistor 5, the switch transistor 12 and the back gate control transistor 14. FIG. 21 is a cross section showing the structure of the diode 17 when the high-side driver IC 10A is integrated. In the preferred embodiment, the diode 17 is formed as a PN junction diode of polysilicon which is formed on an insulating layer 71 on the N⁻ type epitaxial layer 23. Specifically, the diode 17 has a P-type semiconductor region 72 and an N-type semiconductor region 73. The P-type semiconductor region 72 is formed of the polysilicon heavily doped with the P-type impurity and the N-type semiconductor region 73 is formed of polysilicon heavily doped with the N-type impurity. The structure of such a diode 17 is preferable in the point that an undesired parasitic device is not formed. If the diode 17 is formed by diffusing the P-type impurity and the N-type impurity in the N⁻ type epitaxial layer 23, there is a possibility that an undesired parasitic device is formed. It is possible to remove a risk that the undesired parasitic device is formed, by forming the diode 17 as the polysilicon PN junction diode.

Note that in the above-mentioned embodiments, an example has been described in which the control logic circuit 1, the charge pump 2, the gate resistance 3, the output MOS transistor 4, the short-circuit MOS transistor 5, the inverter 6, The power supply terminal 7, the output terminal 8, the switch transistor 12, the load resistance 13, the back gate control transistor 14, and diode 17 (if existing) are integrated on the same semiconductor substrate. However, the configuration of the high-side driver ICs 10 and 10-A is not limited to such a configuration. Note that the advantage of the above-mentioned embodiments (that is, elimination of the problem due to the parasitic bipolar transistor 5a) can be obtained at least in the configuration that the semiconductor substrate that the short-circuit MOS transistor 5 and the switch transistor 12 are formed is connected with the drain of the output MOS transistor 4 and the battery 9 (i.e. the power supply).

Figure 22:
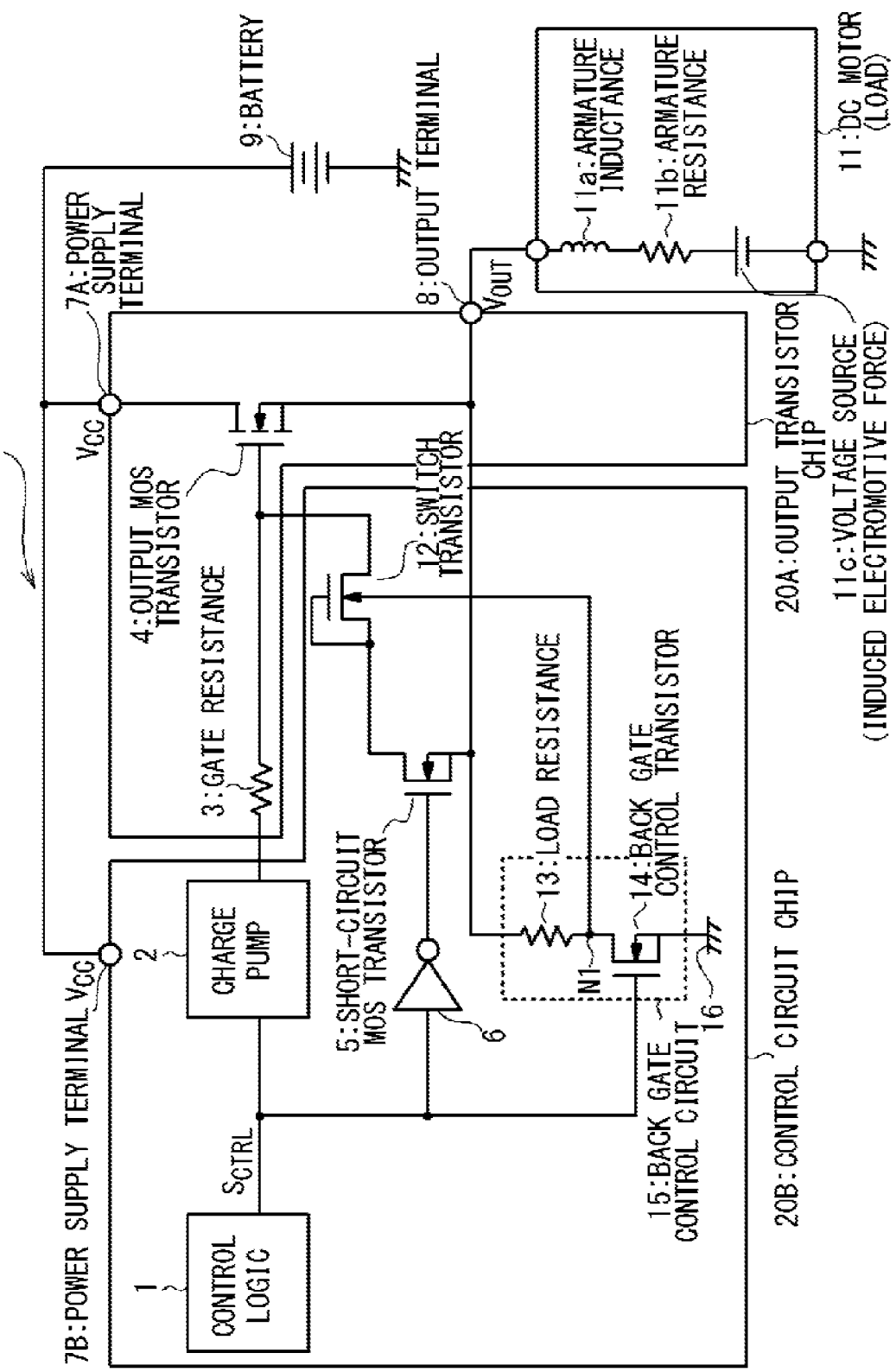
FIG. 22 is a diagram schematically showing the configuration of a modification example of the high-side driver in the first embodiment.

FIG. 22 is a circuit diagram schematically showing an example of a configuration of a high-side driver 10B in which the semiconductor device of the first embodiment (the high-side driver IC) is modified into the multi-chip configuration. The high-side driver 10B of FIG. 22 includes of an output transistor chip 20A and a control circuit chip 20B. The gate resistance 3 and the output MOS transistor 4 are integrated in the output transistor chip 20A. The drain of the output MOS transistor 4 is connected with a power supply terminal 7A which is connected with the battery 9 (i.e. the power supply), and the source of the output MOS transistor 4 is connected with the output terminal 8. The control logic circuit 1, the charge pump 2, the short-circuit MOS transistor 5, the inverter 6, the switch transistor 12, the load resistance 13 and the back gate control transistor 14 are integrated in the control circuit chip 20B. The control circuit chip 20B has the power supply terminal 7B, which is connected with the battery 9. Each of the circuits integrated in the control circuit chip 20B receives the supply of the power supply voltage supplied from the battery 9 or an internal power supply voltage generated from the power supply voltage.

Figure 23:
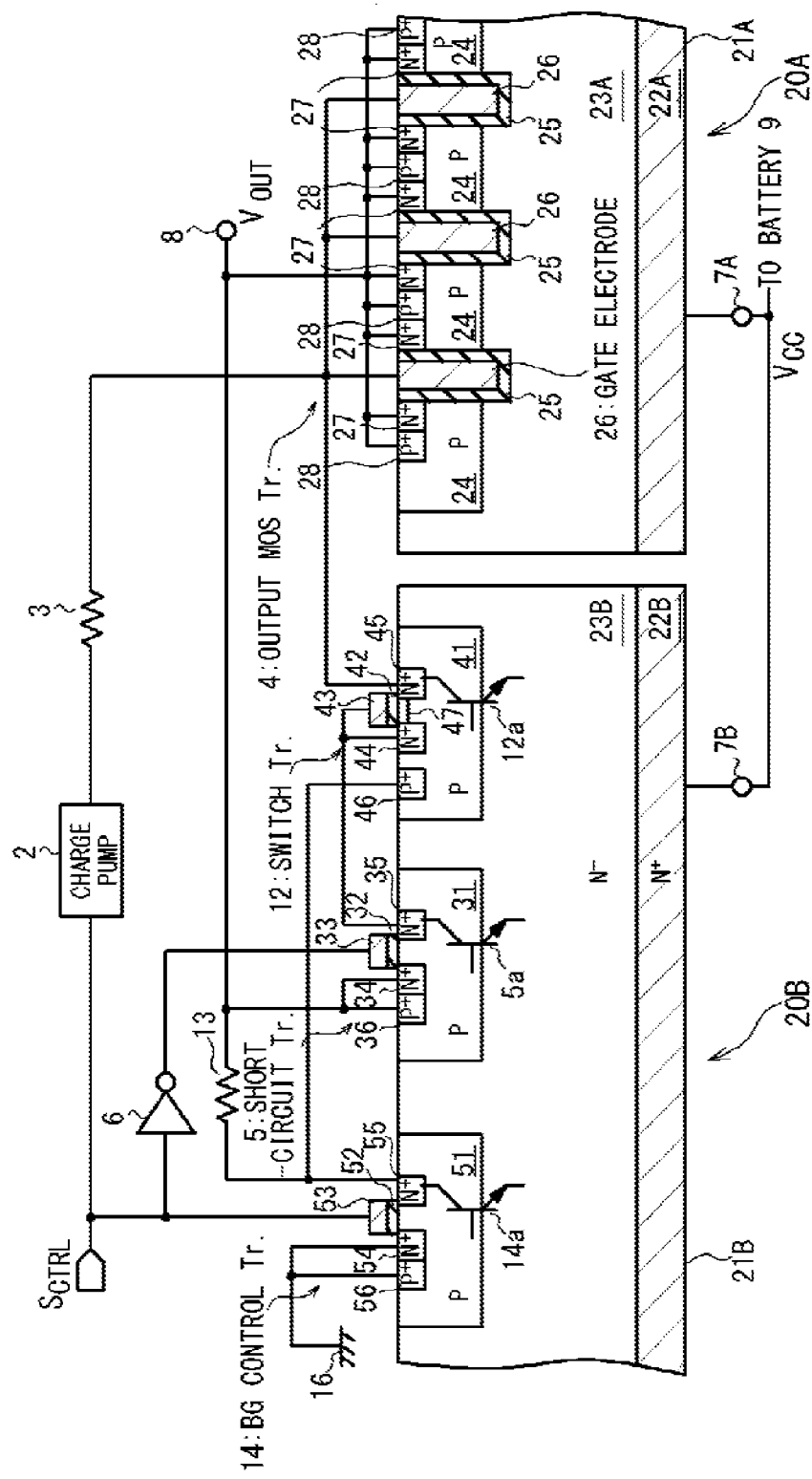
FIG. 23 is a cross section showing the configuration of a modification example of the high-side driver in the first embodiment.

FIG. 23 is a cross section partially showing the configuration of the output transistor chip 20A of the high-side driver 10B and the control circuit chip 20B. The output transistor chip 20A has a semiconductor substrate 21A. The semiconductor substrate 21A includes an $N^+$ type substrate 22A and an $N^-$ type epitaxial layer 23A formed on the $N^+$ type substrate 22A. The $N^+$ type substrate 22A is heavily doped with the N-type impurity and is connected with the power supply terminal 7A. The $N^-$ type epitaxial layer 23A is a semiconductor region doped with the N-type impurity and the output MOS transistor 4 is formed in the surface section of the $N^-$ type epitaxial layer 23A.

The control circuit chip 20B includes a semiconductor substrate 21B. The semiconductor substrate 21B includes an $N^+$ type substrate 22B and an $N^-$ type epitaxial layer 23B formed on the $N^+$ type substrate 22B. The $N^+$ type substrate 22B is heavily doped with the N-type impurity and is connected with the power supply terminal 7B. The $N^-$ type epitaxial layer 23B is a semiconductor region doped with the N-type impurity and the short-circuit MOS transistor 5, the switch transistor 12 and the back gate control transistor 14 are formed in the surface section of the $N^-$ type epitaxial layer 23B.

Figure 24:
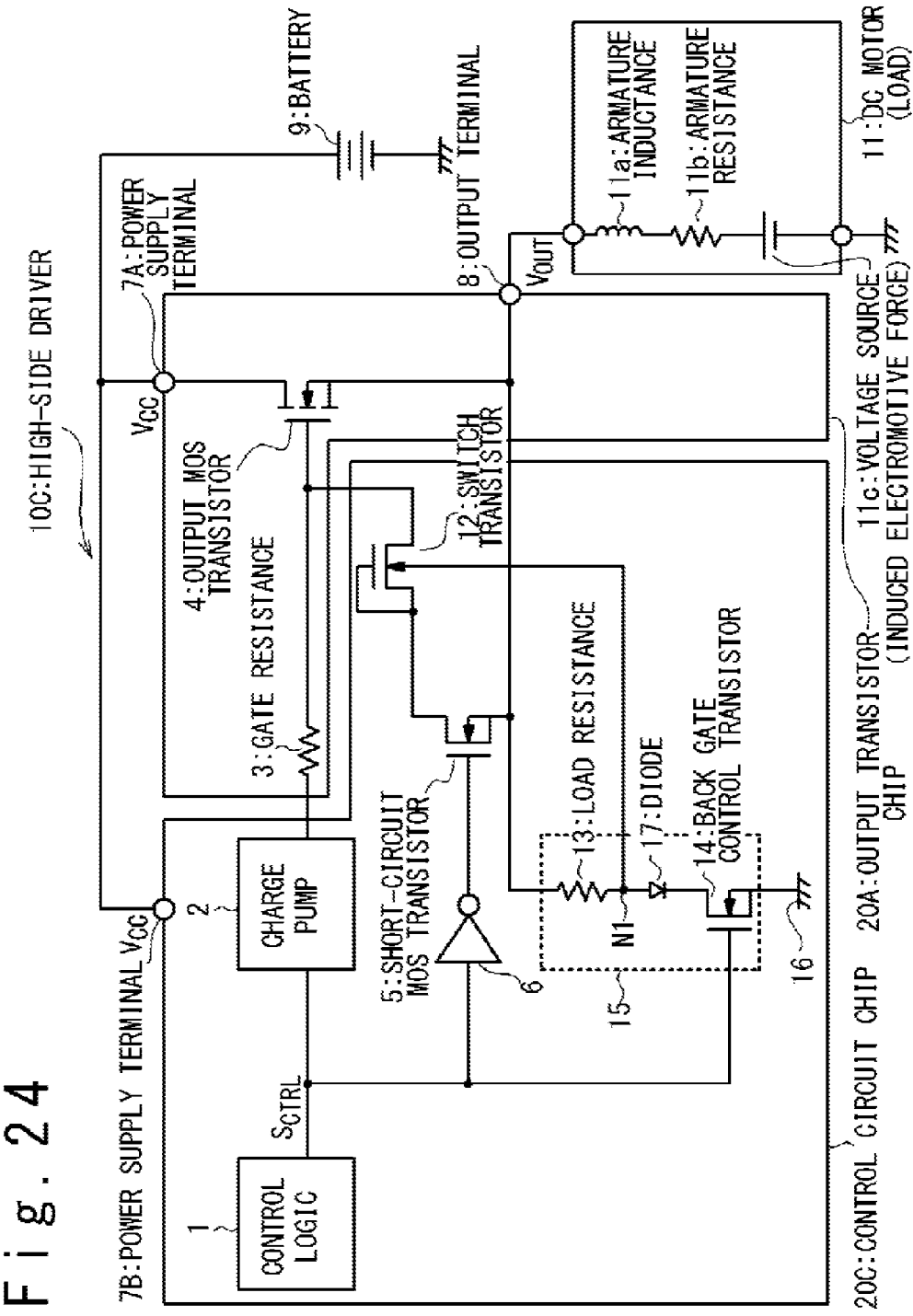
FIG. 24 is a diagram schematically showing the configuration of a modification example of the high-side driver in the second embodiment.

On the other hand, FIG. 24 is a diagram schematically showing a configuration example of a high-side driver 10C when the semiconductor device of the second embodiment is changed into a multi-chip configuration. The high-side driver 10B of FIG. 24 includes a control circuit chip 20C and the output transistor chip 20A having the configuration shown in FIG. 22 and FIG. 23. The control circuit chip 20C has the configuration in which the diode 17 is added to the control circuit chip 20B.

Figure 25:
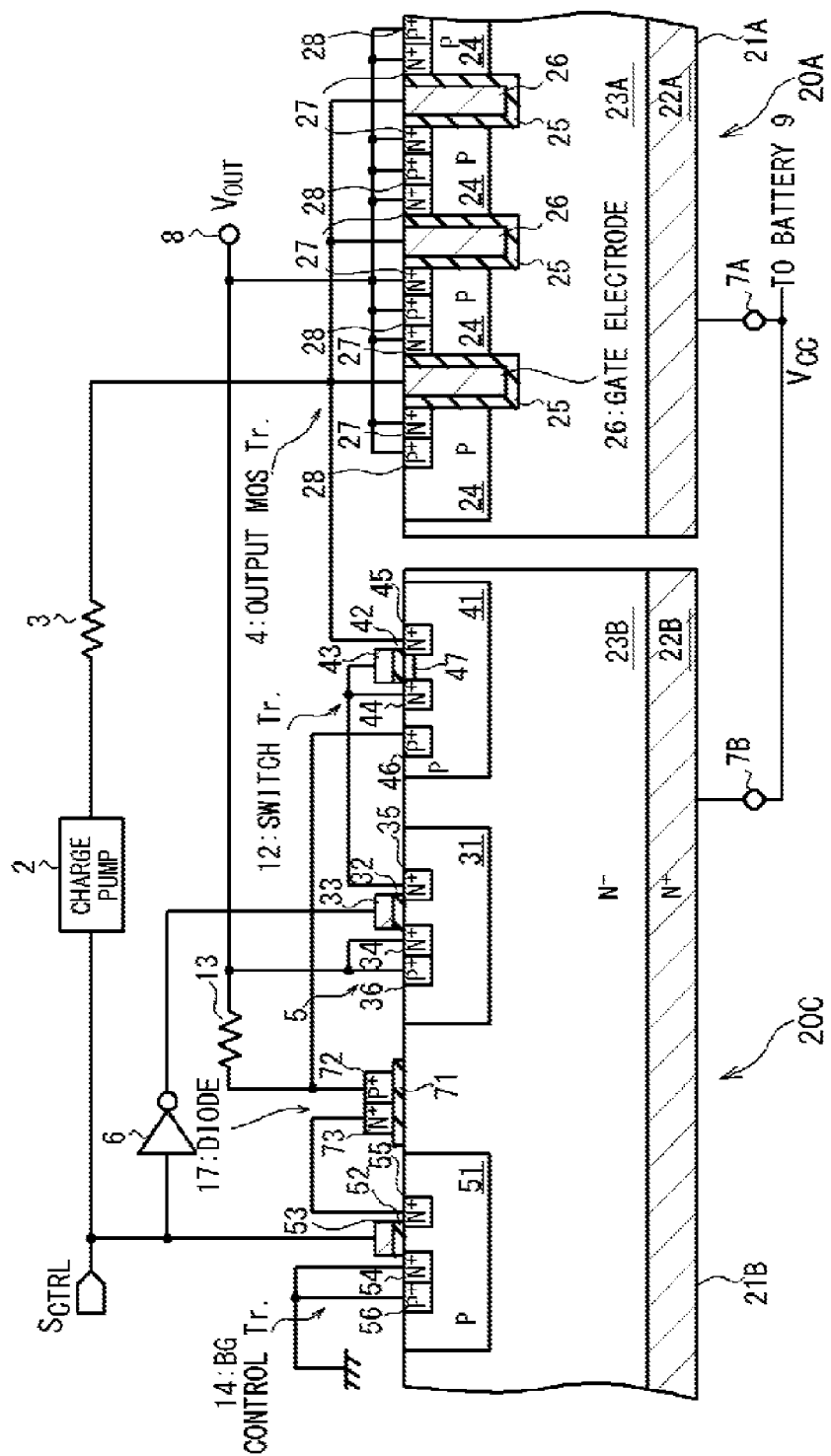
FIG. 25 is a cross section showing the configuration of a modification example of the high-side driver in the second embodiment.

FIG. 25 is a cross section partially showing the configuration of the output transistor chip 20A and the control circuit chip 20C in the high-side driver 10C. The configuration of the output transistor chip 20A of FIG. 25 is the same as the output transistor chip 20A shown in FIG. 23. Also, the configuration of the control circuit chip 20C is the same as that of the control circuit chip 20C shown in FIG. 24 if the diode 17 on the insulating layer 71 formed on the $N^-$ type epitaxial layer 23B is removed. The diode 17 is formed as a PN junction diode formed of polysilicon in the configuration of FIG. 25 to include the P-type semiconductor region 72 and the N type semiconductor region 73.

Also, when the multi-chip configuration is adopted, an IGBT (insulated gate bipolar transistor) may be used instead of the output MOS transistor 4 as the output transistor which is provided for the output transistor chip 20A. As well-known to a skilled person in the art, the IGBT is a device in which both of electrons and holes can be used as carriers by adopting the configuration that a collector region is added to the MOS transistor. Therefore, even if the IGBT is used as the output transistor instead of MOS transistor 4, the essential operation does not change.

Figure 26:
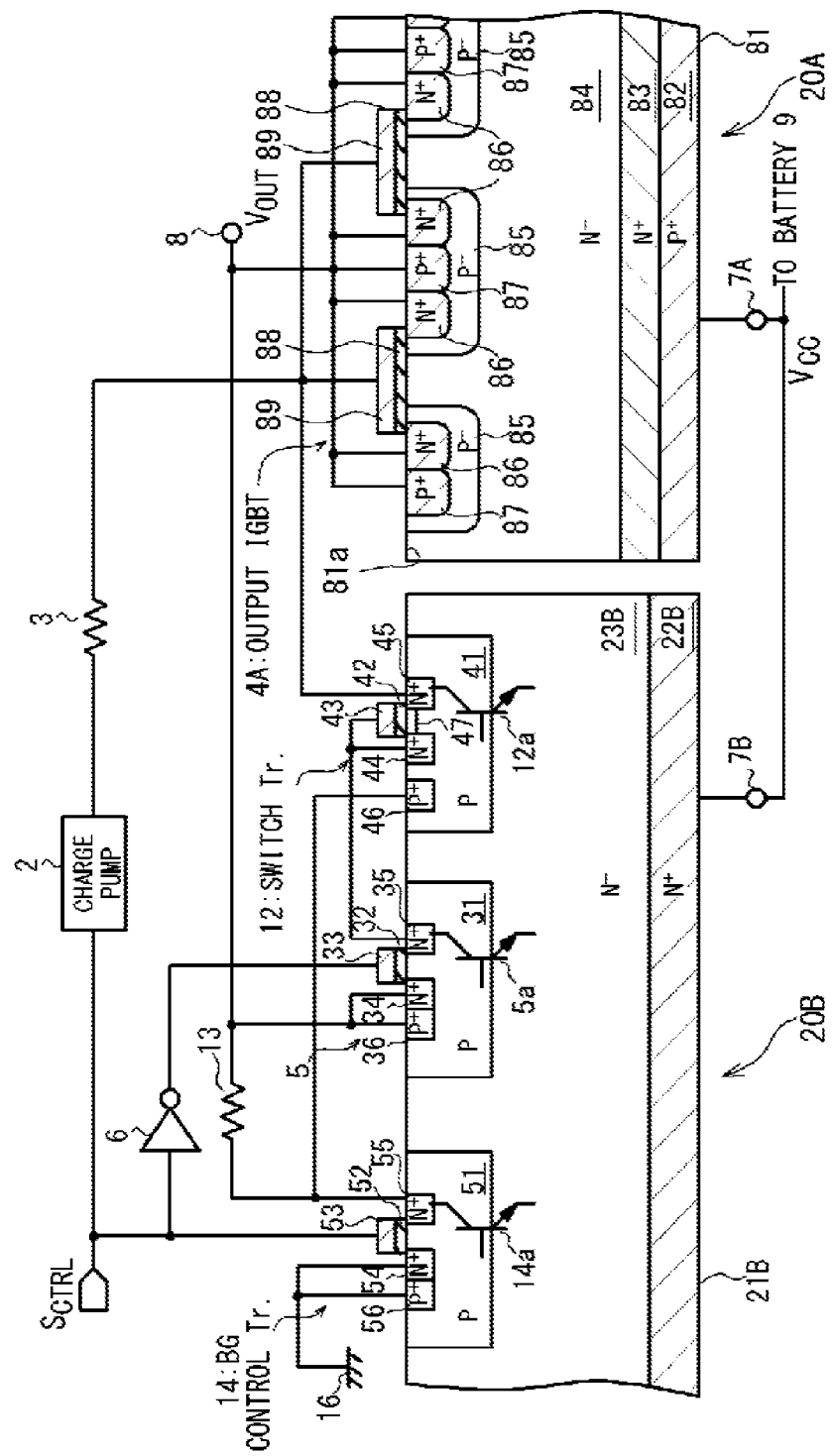
FIG. 26 is a cross section showing the configuration of another modification example of the high-side driver in the first embodiment.

FIG. 26 is a cross section showing the configuration of an output IGBT 4A as the output transistor which is provided for the output transistor chip 20A in the high-side driver 10B shown in FIG. 23. The output transistor chip 20A has a semiconductor substrate 81. The semiconductor substrate 81 includes a P-type collector region 82, an N-type drain region (N-type buffer region) and an $N^-$ type epitaxial layer 84. The P-type collector region 82 is formed of the semiconductor region heavily doped with the P-type impurity and the N-type drain region 83 is formed of the semiconductor region heavily doped with the N-type impurity. The P-type collector region 82 is connected with the power supply terminal 7A connected with the battery 9 (i.e. the power supply) and functions as the collector (the first terminal). The N-type drain region 83 is formed on the P-type collector region 82 and functions as the drain. The $N^-$ type epitaxial layer 84 is the semiconductor region doped with the N-type impurity and is formed on the N-type drain region 83. It should be noted that the N-type drain region 83 is not always necessary and permitted to be omitted.

A plurality of P-type base regions 85 is formed in the $N^-$ type epitaxial layer 84 and the N-type diffusion layer 86 is formed for each of the P-type base regions 85. The P-type base region 85 is a semiconductor region doped with the P-type impurity and also the N-type diffusion layer 86 is a semiconductor region heavily doped with the N-type impurity. Moreover, the P-type diffusion layer 87 heavily doped with the P-type impurity is formed in the surface section of the P-type base region 85. The P-type base regions 85 are distributedly provided and the $N^-$ type epitaxial layer 84 passes through a region between the adjacent P-type base regions 85 to the front-side main surface 81a of the semiconductor substrate 81. Also, the P-type diffusion layer 87 and the N-type diffusion layer 86 function as the emitter (second terminal) of the output IGBT 4A and are connected with the output terminal 8.

Moreover, a gate insulating film 88 is formed to partially cover the upper surface of the P-type base region 85 and $N^-$ type epitaxial layer 84 and a gate electrode 89 is formed on the gate insulating film 88. The gate electrode 89 is formed to oppose to a part of the upper surface of the P-type base region 85 and to oppose to a part of the upper surface of the $N^-$ type epitaxial layer 84. It should be noted that the gate insulating film 88 and the gate electrode 89 may be a trench gate structure as shown in FIG. 3.

As well-known to the skilled person in the art, the IGBT is a device in which both of electrons and holes can be used as carriers by adopting a structure that a collector region is added to the MOS transistor. Therefore, even if the output IGBT 4A is used as the output transistor of the output transistor chip 20A instead of the output MOS transistor 4, the essential operation does not change.

Figure 27:
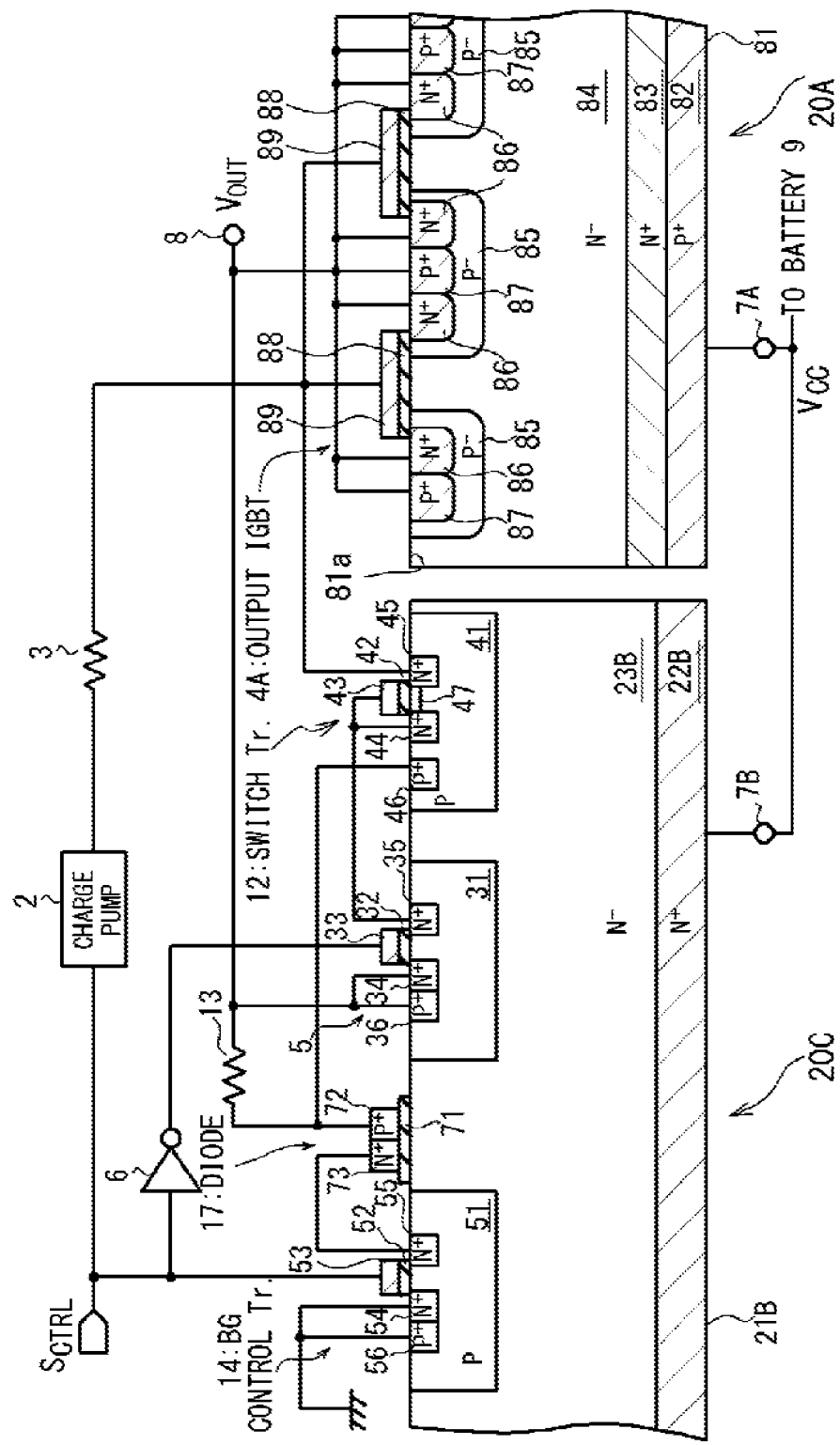
FIG. 27 is a cross section showing the configuration of another modification example of the high-side driver in the second embodiment.

The output IGBT 4A may be used as the output transistor which is provided for the output transistor chip 20A in the high-side driver 10B shown in FIG. 25. FIG. 27 is a cross section showing the configuration of the high-side driver 10B when the output IGBT 4A is provided in the output transistor chip 20A of the high-side driver 10B shown in FIG. 25. The structure of the output IGBT 4A of the output transistor chip 20A shown in FIG. 27 is identical with that of FIG. 26.

Note that the semiconductor device of the multi-chip structure is shown in FIG. 22 to FIG. 27. Here, note that the configuration in which the output MOS transistor 4, the short-circuit MOS transistor 5, the switch transistor 12 and the circuit group which controls them (in the above-mentioned embodiment, the control logic circuit 1, the charge pump 2, the gate resistance 3, the inverter 6, the load resistance 13, the back gate control transistor 14 and the diode 17 (when existing)) are integrated on the same semiconductor substrate is suitable to reduce the number of parts.

As above, the embodiments of the present invention have been specifically described. Here, the present invention is not limited to the embodiments. Various modifications of the embodiments are possible in the range which does not deviate from the scope of the present invention.

What is claimed is:

1. A high-side driver, including a semiconductor device, for use with a battery and a DC motor, the high-side driver comprising:
   a power supply terminal to be coupled to the battery; and
   an output terminal to be coupled to the DC motor,
   wherein the semiconductor device includes:
   an output MOS transistor having a drain coupled to the power supply terminal, a source coupled to the output terminal and a gate;
   a drive circuit coupled to the gate of the output MOS transistor and coupled to receive a control signal and for driving the gate of the output MOS transistor according to the control signal;
   a short-circuit MOS transistor having a source coupled to the output terminal, a gate coupled to receive the control signal and a drain;
   a first switching MOS transistor coupled between the drain of the short-circuit MOS transistor and the gate of the output MOS transistor; and
   a control circuit,
   wherein the short-circuit MOS transistor is formed on a semiconductor substrate coupled to the power supply terminal,
   wherein the first switching MOS transistor comprises:
   a first semiconductor region formed in the semiconductor substrate;
   a drain region formed in the first semiconductor region and coupled to the gate of the output MOS transistor; and
   a source region formed in the first semiconductor region and coupled to the drain of the short-circuit MOS transistor,
   wherein the first switching MOS transistor is turned on or off based on a voltage of the first semiconductor region, and
   wherein the control circuit controls the voltage of the first semiconductor region in response to the control signal.

2. The high-side driver according to claim 1,
   wherein the first switching MOS transistor is formed as a depletion-type N-channel MOS transistor.

3. The high-side driver according to claim 2,
   wherein a conductive type of the first semiconductor region is of a P type,
   wherein a conductive type of the drain region and the source region is of an N⁻ type,
   wherein the first switching MOS transistor further comprises a gate provided to oppose to a region between the drain region and the source region in the first semiconductor region, and
   wherein the gate and the source region are coupled to the drain of the short-circuit MOS transistor.

4. The high-side driver according to claim 3,
   wherein the drive circuit drives the gate of the output MOS transistor when the control signal is in a first level, and stops the drive of the gate of the output MOS transistor when the control signal is in a second level,
   wherein the short-circuit MOS transistor is turned off when the control signal is in the first level and is turned on when the control signal is in the second level, and
   wherein the control circuit controls the voltage of the first semiconductor region to be coincident with that of the output terminal when the control signal is in the first level, and the voltage of the first semiconductor region to be a ground voltage when the control signal is in the second level.

5. The high-side driver according to claim 3,
   wherein the control circuit comprises:
   a resistance element coupled between the output terminal and a connection node which is coupled to the first semiconductor region; and
   a second switching MOS transistor coupled between the connection node and a ground terminal and configured to turn on or off according to the control signal.

6. The high-side driver according to claim 5, further comprising:
   a diode coupled in series with the second switching MOS transistor between the connection node and the ground terminal.

7. The high-side driver according to claim 6,
   wherein the diode comprises:
   a P-type semiconductor region formed on an insulating layer which is formed on a surface of the semiconductor substrate; and
   the N-type semiconductor region formed on the insulating layer and connected with the P-type semiconductor region.

8. The high-side driver according to claim 1,
   wherein the semiconductor substrate comprises:
   an N⁺ type substrate coupled to the power supply terminal; and
   an N⁻ type epitaxial layer formed on the N⁺ type substrate, and
   wherein the first semiconductor region is formed in a surface section of the N⁻ type epitaxial layer.

9. A high-side driver for use with a battery and a DC motor, the high-side driver comprising:
   a power supply terminal to be coupled to the battery;
   an output terminal to be coupled to the DC motor;
   an output transistor having a first terminal coupled to the power supply terminal, a second terminal coupled to the output terminal and a control terminal;
   a drive circuit configured to drive the control terminal of the output transistor according to a control signal;
   a short-circuit MOS transistor which has a source coupled to the output terminal, and which is an N-channel MOS transistor having a gate receiving an inversion signal of the control signal;
   a switch transistor as a depletion-type N-channel MOS transistor; and
   a control circuit, wherein the short-circuit MOS transistor and the switch transistor are integrated on a semiconductor substrate coupled to the power supply terminal, wherein a gate and a source of the switch transistor are coupled to a drain of the short-circuit MOS transistor, wherein the drain of the switch transistor is coupled to the control terminal of the output transistor, and wherein the control circuit is configured to control a voltage of a back gate of the switch transistor in response to the control signal.

10. The high-side driver according to claim 9, wherein the drive circuit drives the control terminal of the output transistor when the control signal is in a first level, and stops the drive of the control terminal of the output transistor when the control signal is in a second level, wherein the short-circuit MOS transistor is turned off when the control signal is in the first level and is turned on when the control signal is the second level, and wherein the control circuit controls the voltage of the back gate of the switch transistor to be coincident with that of the output terminal when the control signal is in the first level, and the voltage of the back gate of the switch transistor to be the ground voltage when the control signal is in the second level.

11. The high-side driver according to claim 10, wherein the control circuit comprises:

a resistance element coupled between the output terminal and a connection node coupled to a back gate of the switch transistor; and a second switching transistor coupled between the connection node and a ground terminal and configured to switch an ON state and an OFF state off in response to the control signal.

12. The high-side driver according to claim 11, further comprising:

a diode coupled in series with the second switching transistor between the connection node and the ground terminal.

13. The high-side driver according to claim 9, wherein the output transistor comprises an output MOS transistor, wherein the first terminal is the drain of the output MOS transistor, wherein the second terminal is the source of the output MOS transistor, wherein the control terminal is the gate of the output MOS transistor.

14. The high-side driver according to claim 9, wherein the output transistor comprises an IGBT (insulated gate bipolar transistor), wherein the first terminal is the collector of the IGBT, the second terminal is an emitter of the IGBT, and the control terminal is the gate of the IGBT.

15. An in-vehicle device comprising:

a battery;

a high-side driver; and a DC motor, wherein the high-side driver comprises:

a power supply terminal coupled to receive a power supply from the battery;

an output terminal coupled to drive the DC motor;

an output transistor having a drain coupled to the power supply terminal and a source coupled to the output terminal;

a drive circuit configured to drive a control terminal of the output transistor according to a control signal;

a MOS transistor having a source coupled to the output terminal and being operated according to the control signal;

a switching transistor coupled between the control terminal of the output transistor and the drain of the MOS transistor; and a control circuit coupled to provide the control signal, wherein the MOS transistor is integrated on a semiconductor substrate which is coupled to the power supply terminal, wherein the switching transistor comprises:

a semiconductor region formed in the semiconductor substrate;

a first layer formed in the semiconductor region and coupled to the control terminal of the output transistor; and a second layer formed in the semiconductor region and coupled to the drain of the short-circuit MOS transistor, wherein the switching transistor is turned on and off according to a voltage of the semiconductor region, and wherein the control circuit controls the voltage of the semiconductor region according to the control signal.

* * * * *